United States Patent
Sato et al.

(10) Patent No.: US 11,996,295 B2
(45) Date of Patent: May 28, 2024

(54) PATTERN FORMING METHOD AND METHOD FOR MANUFACTURING SEMICONDUCTOR DEVICE

(71) Applicant: Kioxia Corporation, Tokyo (JP)

(72) Inventors: Hironobu Sato, Yokkaichi Mie (JP); Yoshihiro Naka, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 337 days.

(21) Appl. No.: 17/463,774

(22) Filed: Sep. 1, 2021

(65) Prior Publication Data

US 2022/0084833 A1 Mar. 17, 2022

(30) Foreign Application Priority Data

Sep. 17, 2020 (JP) ................. 2020-156068

(51) Int. Cl.
| | |
|---|---|
| *H01L 21/308* | (2006.01) |
| *H01L 21/02* | (2006.01) |
| *H01L 21/027* | (2006.01) |
| *H01L 21/033* | (2006.01) |

(52) U.S. Cl.
CPC ...... *H01L 21/3081* (2013.01); *H01L 21/0223* (2013.01); *H01L 21/0274* (2013.01); *H01L 21/0332* (2013.01)

(58) Field of Classification Search
CPC ............. H01L 21/3081; H01L 21/0223; H01L 21/0274; H01L 21/0332; H01L 21/0337

USPC ..................................................... 438/703
See application file for complete search history.

(56) References Cited

U.S. PATENT DOCUMENTS

| | | | |
|---|---|---|---|
| 8,093,159 B2 | 1/2012 | Mizuno et al. | |
| 2012/0241411 A1 | 9/2012 | Darling et al. | |
| 2019/0259606 A1 | 8/2019 | Yamamoto et al. | |
| 2020/0013620 A1 | 1/2020 | Fung et al. | |
| 2021/0074549 A1* | 3/2021 | Sato ................. | H01L 21/67063 |

FOREIGN PATENT DOCUMENTS

| | | |
|---|---|---|
| JP | 2012-004170 A | 1/2012 |
| JP | 5385001 B2 | 1/2014 |
| JP | 2019-145714 A | 8/2019 |

* cited by examiner

*Primary Examiner* — Caleen O Sullivan
(74) *Attorney, Agent, or Firm* — Foley & Lardner LLP

(57) ABSTRACT

According to one embodiment, a pattern forming method includes: forming a first mask layer on a sample; forming a second mask layer on the first mask layer, the second mask layer containing a first inorganic material and a first organic material; forming a pattern in the second mask layer; oxidizing the first inorganic material and removing at least a portion of the first organic material from the second mask layer by exposing the second mask layer to a first oxidizing gas containing ozone; and transferring the pattern to the first mask layer by etching the first mask layer with the second mask layer.

22 Claims, 20 Drawing Sheets

FIG. 2
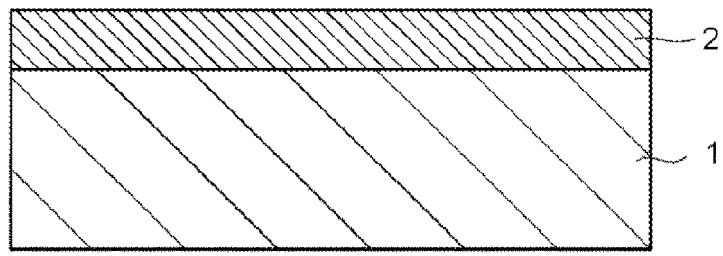
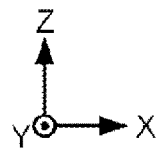
FIG. 3
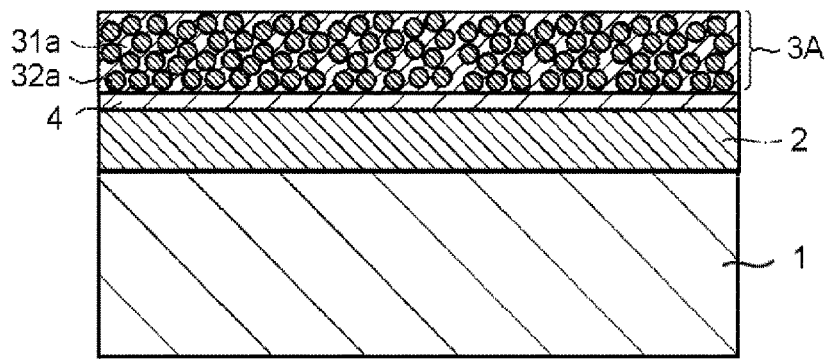
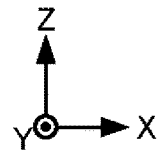
FIG. 4
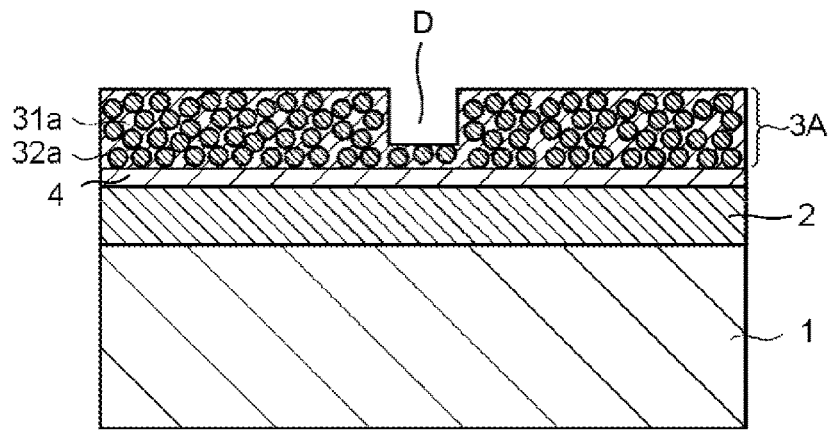
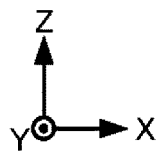

FIG. 20
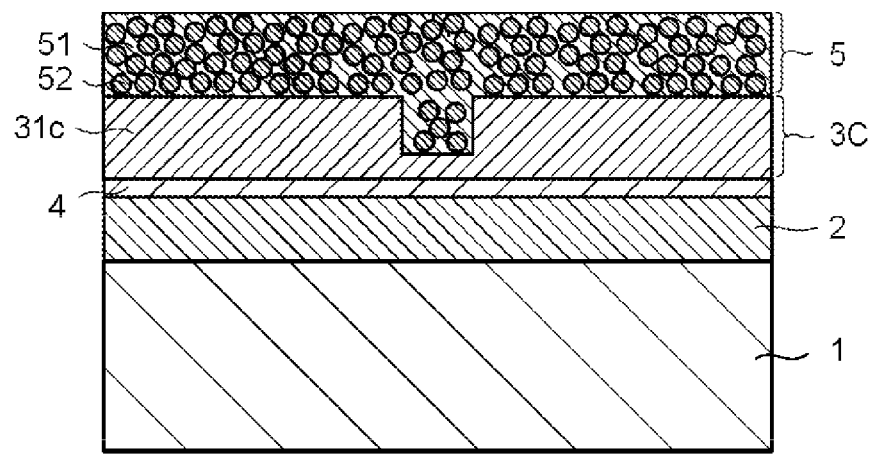
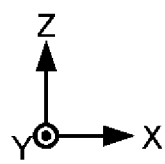
FIG. 21
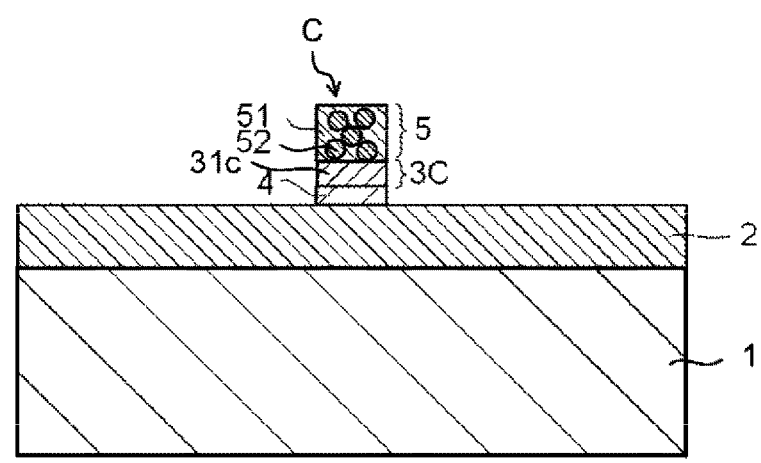
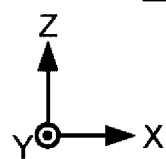

FIG. 24
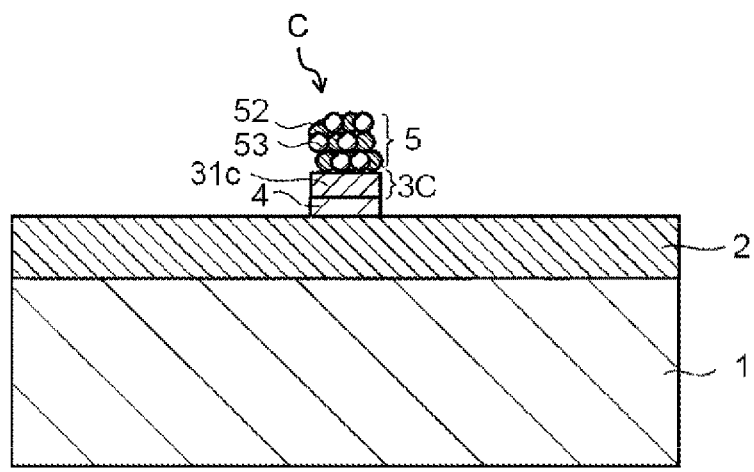
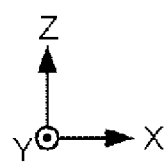
FIG. 25
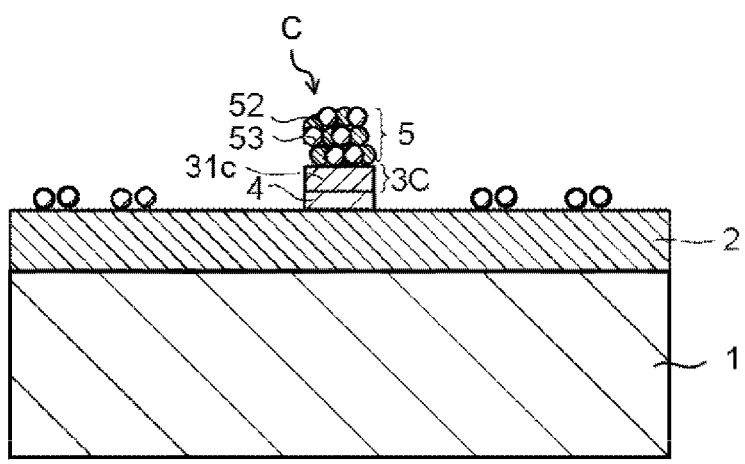
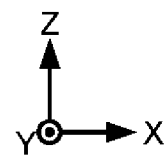

FIG. 30
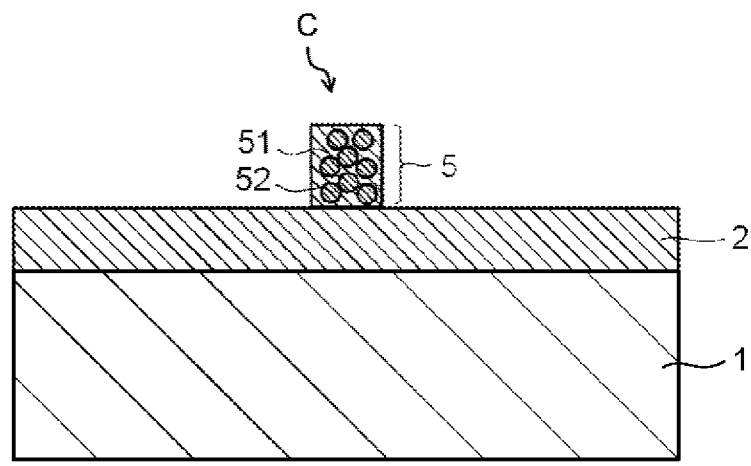
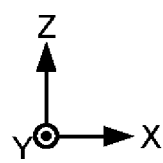
FIG. 31
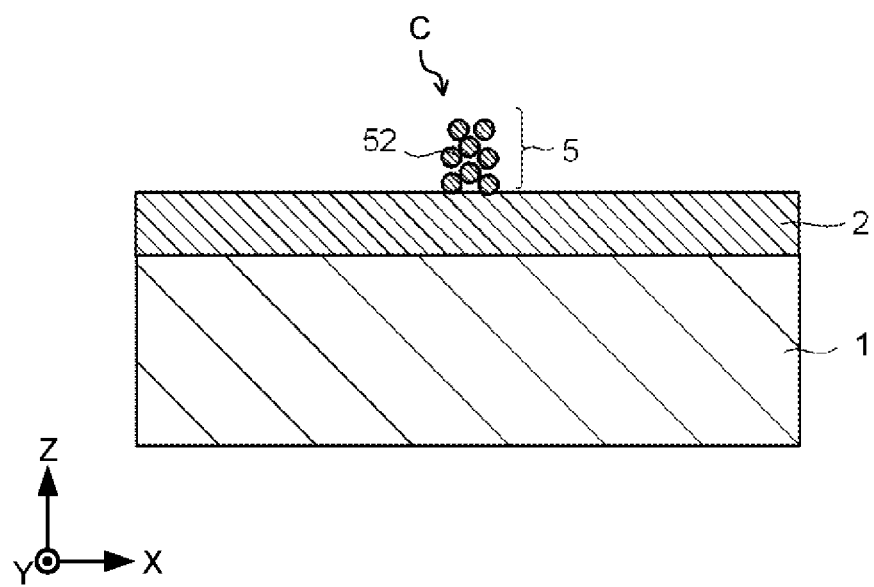

FIG. 34
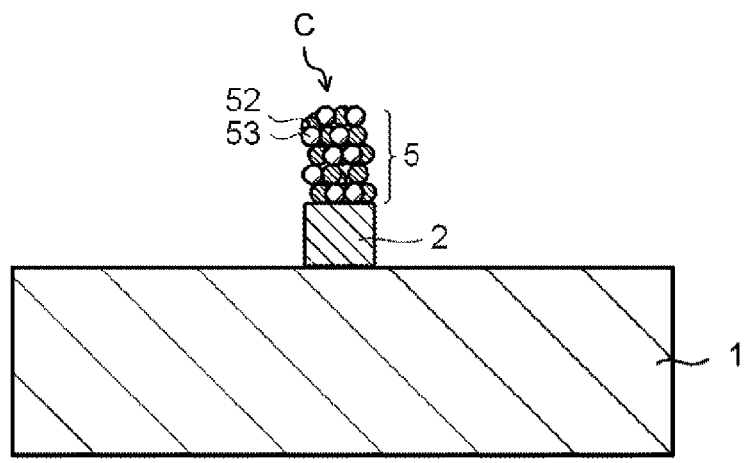
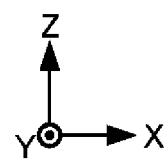
FIG. 35
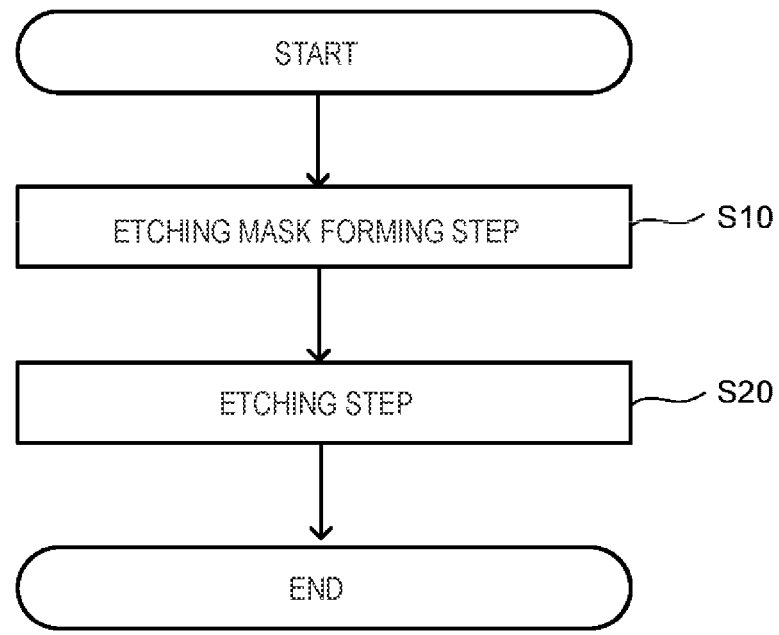

FIG. 38
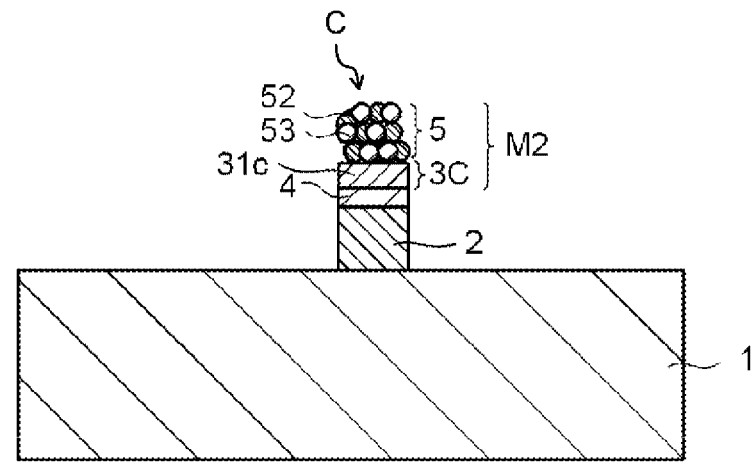
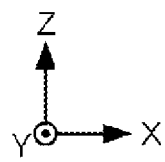
FIG. 39
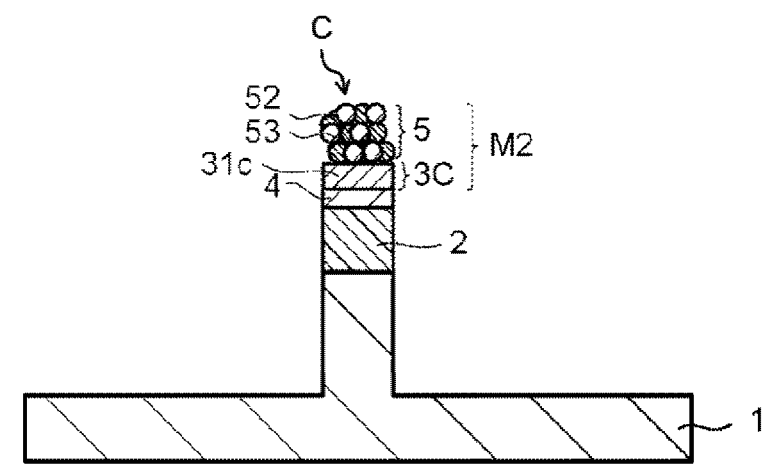
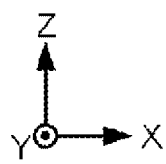

PATTERN FORMING METHOD AND METHOD FOR MANUFACTURING SEMICONDUCTOR DEVICE

CROSS-REFERENCE TO RELATED APPLICATION(S)

This application is based upon and claims the benefit of priority from. Japanese Patent Application No. 2020-156068, filed on Sep. 17, 2020, the entire contents of which are incorporated herein by reference.

FIELD

Embodiments described herein relate generally to a pattern forming method and a method for manufacturing a semiconductor device.

BACKGROUND

In a method for manufacturing a semiconductor device such as a three-dimensional memory, a technology for etching a processing target using a hard mask containing a metal oxide serving as an etching mask is known.

DESCRIPTION OF THE DRAWINGS

FIG. 2 is a schematic cross-sectional view illustrating an example of a first mask layer forming step S1-1.

FIG. 3 is a schematic cross-sectional view illustrating an example of a second mask layer forming step S1-2.

FIG. 4 is a schematic cross-sectional view illustrating a pattern forming step S1-3.

FIG. 20 is a schematic cross-sectional view illustrating an example of a third mask layer forming step S2-4.

FIG. 21 is a schematic cross-sectional view illustrating an inverted pattern forming step S2-5.

FIG. 24 is a schematic cross-sectional view illustrating an example of a cycle step S2-7.

FIG. 25 is a schematic cross-sectional view illustrating an example of the cycle step S2-7.

FIG. 30 is a schematic cross-sectional view illustrating the inverted pattern forming step S2-5.

FIG. 31 is a schematic cross-sectional view illustrating an example of the oxidizing step S2-6.

FIG. 34 is a schematic cross-sectional view illustrating an example of the etching step S2-8.

FIG. 35 is a flowchart illustrating an example of a method for manufacturing a semiconductor device.

FIG. 38 is a schematic cross-sectional view illustrating an example of the etching mask forming step S10.

FIG. 39 is a schematic cross-sectional view illustrating an example of the etching step S20.

DETAILED DESCRIPTION

Figure 1:
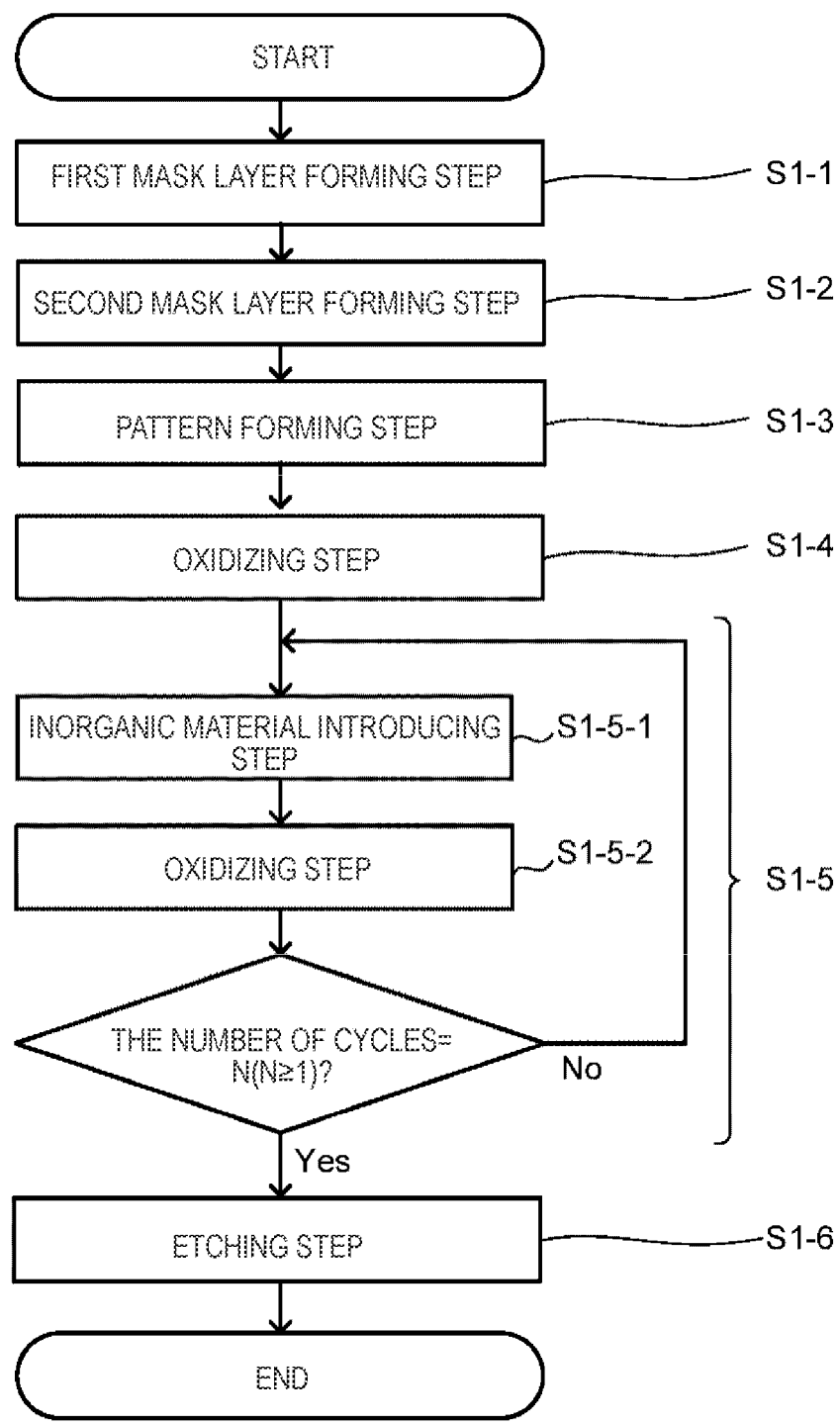
FIG. 1 is a flowchart illustrating an example of a pattern forming method.

Embodiments provide a method for easily forming a hard mask having a pattern.

In general, according to one embodiment, a pattern forming method includes: forming a first mask layer on a sample; forming a second mask layer on the first mask layer, the second mask layer containing a first inorganic material and a first organic material; forming a pattern in the second mask layer; oxidizing the first inorganic material and removing at least a portion of the first organic material from the second mask layer by exposing the second mask layer to a first oxidizing gas containing ozone; and transferring the pattern to the first mask layer by etching the first mask layer with the second mask layer.

Hereinafter, embodiments will be described with reference to drawings. The relationship between the thickness of each component and the plane dimension illustrated in the drawings, the ratio of the thickness of each component may be different from the actual product. Further, in the embodiments, substantially the same components are designated by the same reference numerals, and the description thereof will be omitted as appropriate.

First Embodiment

FIG. 1 is a flowchart illustrating an example of a pattern forming method. As illustrated in FIG. 1, the example of the pattern forming method includes a first mask layer forming step S1-1, a second mask layer forming step S1-2, a pattern forming step S1-3, an oxidizing step S1-4, a cycle step S1-5, and an etching step S1-6.

[First Mask Layer Forming Step S1-1]

FIG. 2 is a schematic cross-sectional view illustrating an example of the first mask layer forming step S1-1, and illustrates a part of the X-Z cross section including the X axis of a processing target (or sample) 1, and the Z axis orthogonal to the X axis and orthogonal to the Y axis orthogonal to the X axis. As illustrated in FIG. 2, in the first mask layer forming step S1-1, a mask layer 2 is formed on the processing target 1.

The processing target 1 includes, for example, a memory layer that constitutes a memory such as a phase change memory (PCM) provided on a substrate such as a silicon substrate.

The mask layer 2 contains, for example, an organic material. The mask layer 2 includes, for example, a spin on carbon (SOC) film. The SOC film is a carbon-based thin film formed by a spin coating method by applying a material containing carbon.

[Second Mask Layer Forming Step S1-2]

FIG. 3 is a schematic cross-sectional view illustrating an example of the second mask layer forming step S1-2, and illustrates a part of the X-Z cross section of the processing target 1. As illustrated in FIG. 3, in the second mask layer forming step S1-2, a mask layer 3A is formed on the mask layer 2.

The mask layer 3A contains an organic material 31a and an inorganic material 32a. The mask layer 3A is bonded to the mask layer 2 via an adhesive layer 4. Examples of the adhesive layer 4 include an organic film containing carbon. The adhesive layer 4 does not necessarily have to be provided. The mask layer 3A is formed by applying a composite material containing the organic material 31a and the inorganic material 32a onto the surface of the adhesive layer 4. It may be desirable to use the composite material because it is not necessary to add a step of impregnating the mask layer 3A with the inorganic material 32a.

The organic material 31a is a polymer material containing carbon, and includes, for example, a nanoimprint material such as an ultraviolet curable resin applicable to nanoimprint lithography (NIL). The organic material 31a has reaction sites capable of reacting with the inorganic material 32a. The reaction sites capable of reacting with the inorganic material 32a include, for example, an unshared electron pair to which the inorganic material may be coordinated, and examples thereof include an unshared electron pair present in a functional group such as a carbonyl group or an amide group contained in a polymer.

In contrast to the mask layer 3A, the mask layer 2 contains an organic material that has a smaller number of reaction sites than the mask layer 3A or has no reaction site. In order to decrease the reaction sites of the mask layer 2, the oxygen concentration of the mask layer 2 may be lower than the oxygen concentration of the mask layer 3A, and the oxygen concentration of the mask layer 2 may be 26.2% by mass or less. The oxygen concentration may be measured by measuring the atomic composition contained in the mask layer 2 by Rutherford backscattering spectrometry (RBS) or hydrogen forward scattering spectrometry (HFS), and multiplying the composition by the atomic weight to express the oxygen content as a percentage.

The inorganic material 32a is an inorganic compound containing at least one element selected from the group consisting of semi-metal elements. The semi-metal elements are materials having an intermediate property between a metal element and a non-metal element, and include, for example, silicon (Si).

[Pattern Forming Step S1-3]

Figure 5:
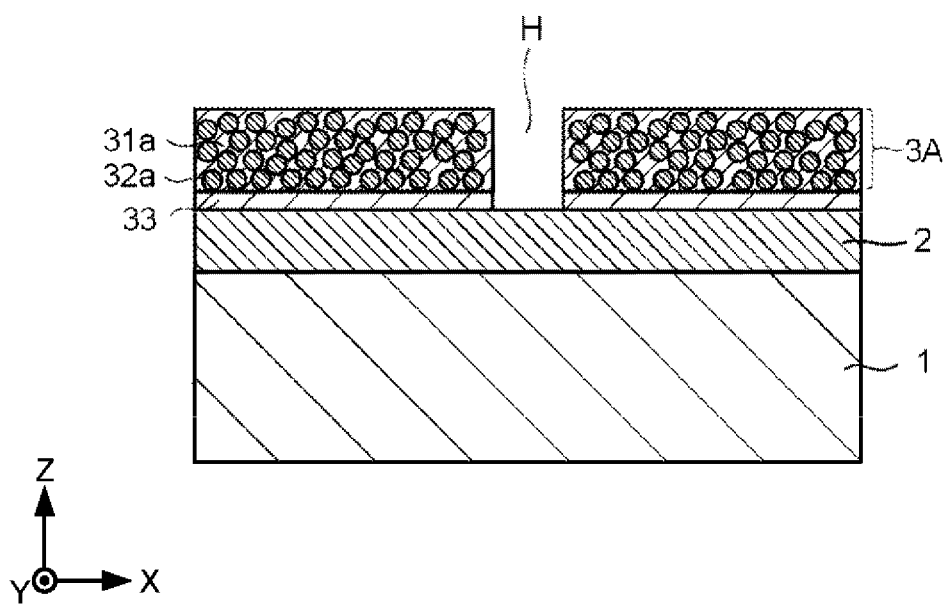
FIG. 5 is a schematic cross-sectional view illustrating the pattern forming step S1-3.

FIGS. 4 and 5 are schematic cross-sectional views illustrating the pattern forming step S1-3, and illustrate a part of the X-Z cross section of the processing target 1. As illustrated in FIG. 4, in the pattern forming step S1-3, the mask layer 3A is processed to form a recess D. In the pattern forming method using NIL, a mold (template) is pressed onto the mask layer 3A and irradiated with light to cure the mask layer 3A, thereby forming a pattern including the recess D in the mask layer 3A. At this time, a part of the mask layer 3A remains under the recess D.

Further, as illustrated in FIG. 5, in the pattern forming step S1-3, the recess in the mask layer 3A is etched to remove the remaining portion of the mask layer 3A under the recess D, thereby forming a pattern including an opening H. At this time, a part of the adhesive layer 4 that is in contact with the recess D is also etched.

Since the thickness of the remaining portion (residual layer thickness; RLT) of the mask layer 3A under the recess D has a constant value regardless of the pattern size, as the pattern miniaturization progresses, the relative thickness with respect to the height of the pattern becomes so large that it cannot be ignored. As a result, as the miniaturization progresses, the mask layer 3A after removing the remaining portion tends to become thinner.

Meanwhile, in the embodiment, it is possible to prevent the decrease in the thickness of the mask layer 3A after forming the pattern by forming the mask layer 3A using a composite material of the organic material 31a and the inorganic material 32a.

[Oxidizing Step S1-4]

Figure 6:
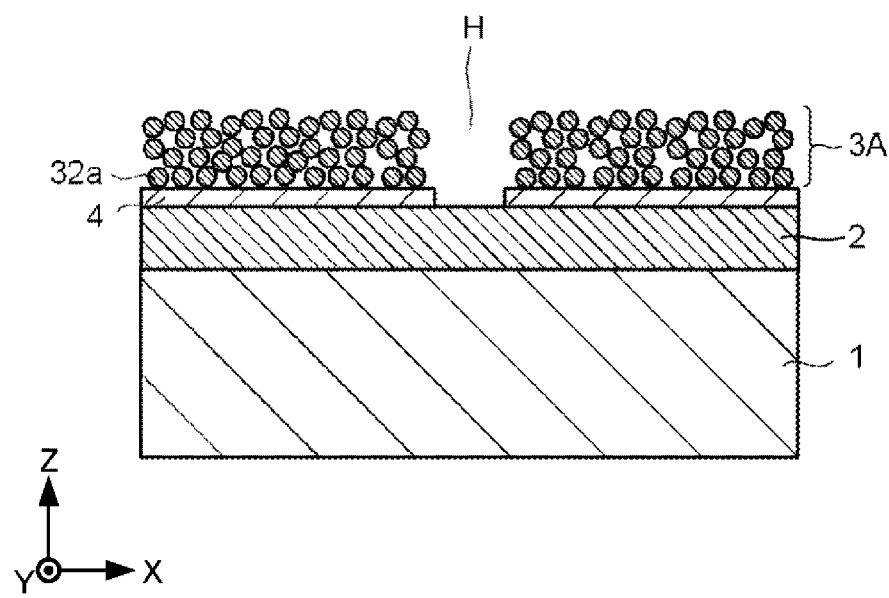
FIG. 6 is a schematic cross-sectional view illustrating an example of an oxidizing step S1-4.
Figure 7:
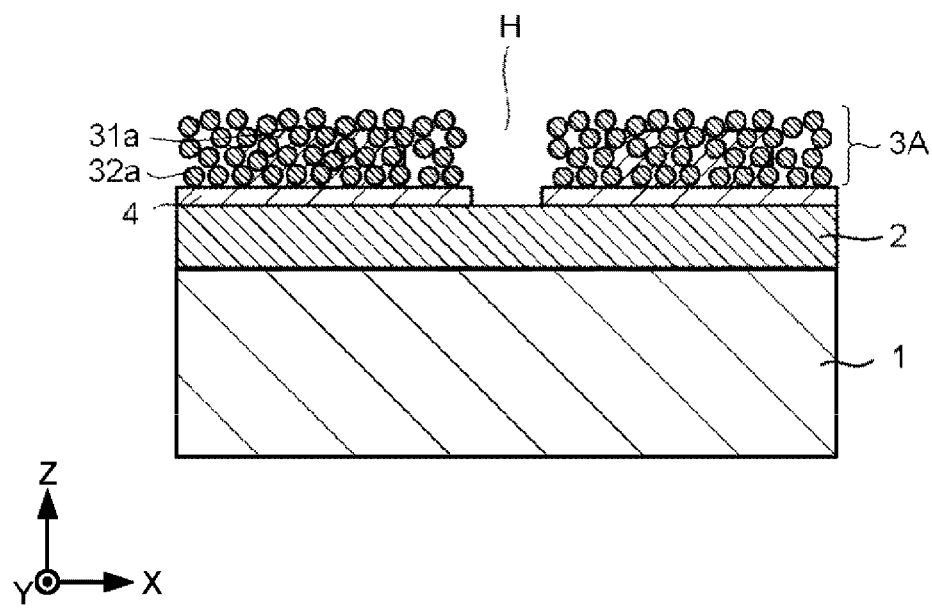
FIG. 7 is a schematic cross-sectional view illustrating an example of the oxidizing step S1-4.

FIGS. 6 and 7 are schematic cross-sectional views illustrating an example of the oxidizing step S1-4, and illustrate a part of the X-Z cross section of the processing target 1. In the oxidizing step S1-4, the mask layer 3A is exposed to a first oxidizing gas. The first oxidizing gas is exhausted after the exposure.

The organic material 31a in the mask layer 3A has reaction sites that react with the inorganic material 32a. By exposing the mask layer 3A to the first oxidizing gas, the first oxidizing gas may oxidize the inorganic material 32a to form an oxide of the inorganic material 32a.

The first oxidizing gas contains, for example, ozone. Since ozone has a high oxidizing power, when the first oxidizing gas contains ozone, as illustrated in FIGS. 6 and 7, at least a part of the organic material 31a is removed by exposing the mask layer 3A to the first oxidizing gas. The oxide of the inorganic material 32a remaining after the organic material 31a is removed is, for example, amorphous or crystalline.

Due to the formation of the oxide of the inorganic material 32a or the removal of the organic material 31a, the oxygen atom concentration and the semi-metal atom concentration of the mask layer 3A are increased, and the carbon atom concentration thereof is decreased. The oxygen atom concentration, the carbon atom concentration, and the semi-metal atom concentration may be measured by, for example, an X-ray photoelectron spectroscopy (XPS) method.

The amount of the organic material 31a removed by the exposure may be adjusted according to, for example, the processing conditions such as a processing temperature and a processing time. For example, by performing the exposure at a first processing temperature and for a first processing time, the entire organic material 31a may be removed as illustrated in FIG. 6. Therefore, since the mask layer 3A may be formed by the inorganic material 32a, an etching mask, which is a hard mask having a high selectivity with respect to the mask layer 2, may be formed. Further, by performing the exposure at a second processing temperature lower than the first processing temperature or for a second processing time shorter than the first processing time, as illustrated in FIG. 7, a part of the organic material 31a may be removed and the other part thereof may remain. Therefore, the shrinkage rate of the mask layer 3A may be reduced, and thus, the dimensional accuracy of the pattern may be improved.

In the oxidizing step S1-4, the oxide of the inorganic material 32a is formed and at least a part of the organic material 31a is removed, and thus, characteristics such as etching selectivity, etching resistance, and peeling performance of the mask layer 3A may be improved.

[Cycle Step S1-5]

In the cycle step S1-5, an inorganic material introducing step S1-5-1 and an oxidizing step S1-5-2 are alternately switched, for example, until the number of cycles reaches N (N is a natural number of 1 or more). The number of the cycles is appropriately set according to parameters required for the etching mask. The cycle step S1-5 may not always be performed (N=0).

Figure 8:
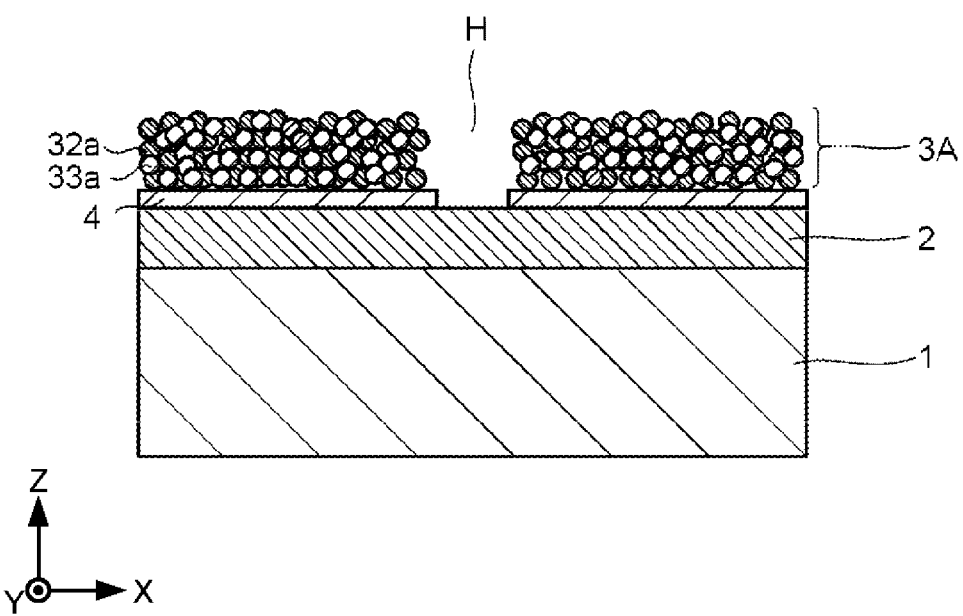
FIG. 8 is a schematic cross-sectional view illustrating an example of a cycle step S1-5.
Figure 9:
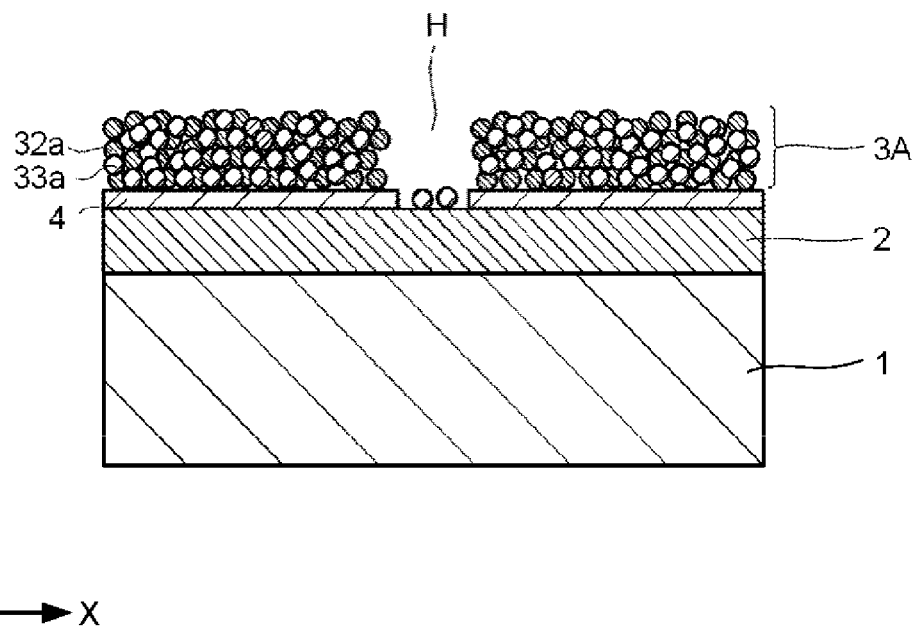
FIG. 9 is a schematic cross-sectional view illustrating an example of the cycle step S1-5.

FIGS. 8 and 9 are schematic cross-sectional views illustrating an example of the cycle step S1-5, and illustrate a part of the X-Z cross section of the processing target 1. In the inorganic material introducing step S1-5-1, the mask layer 3A is exposed to a first gas containing an inorganic material 33a. As illustrated in FIG. 8, the inorganic material 33a is introduced to the mask layer 3A. After exhausting the first gas, in the oxidizing step S1-5-2, the mask layer 3A is exposed to a second oxidizing gas containing ozone. The second oxidizing gas is exhausted after the exposure.

The inorganic material 33a forms an oxide by reacting with the second oxidizing gas and being oxidized. Therefore, the film density of the mask layer 3A may be increased.

The inorganic material 33a is an inorganic compound the same as or different from the inorganic material 32a. The inorganic material 33a is an inorganic compound containing at least one element selected from the group consisting of semi-metal elements. The semi-metal element includes, for example, silicon (Si).

The inorganic material 33a is a precursor that may be used, for example, by a chemical vapor deposition (CVD) method or an atomic layer deposition (ALD) method. For example, an example of a precursor containing silicon is tris(dimethylamino) silane (TDMAS). When using a plurality of precursors, it is desirable to use precursors that hardly react with each other or do not react with each other.

The amount of the inorganic material 33a that may penetrate into the mask layer 3A is limited depending on the reaction site. Meanwhile, the limitation of the amount is alleviated by removing at least a part of the organic material 31a in the oxidizing step S1-4 as described above.

By repeating the switching between the inorganic material introducing step S1-5-1 and the oxidizing step S1-5-2, as illustrated in FIG. 9, the oxide of the inorganic material 33a may be formed on the surface of the mask layer 2 in the opening H by a functional group such as an OH group on the surface of the mask layer 2. At this time, the oxide may be removed by exposing the surface of the mask layer 2 to a gas containing fluorine such as sulfur hexafluoride ($SF_6$). After that, the inorganic material introducing step S1-5-1 and the oxidizing step S1-5-2 may be alternately switched again.

By alternately switching the inorganic material introducing step S1-5-1 and the oxidizing step S1-5-2, the film density of the mask layer 3A may be increased. Therefore, it is possible to increase etching resistance, particularly high reactive ion etching (RIE) resistance. For example, when forming a pattern having a high aspect ratio, the etching mask is exposed to an etching gas for a long time, and thus, high etching resistance is required.

[Etching Step S1-6]

Figure 10:
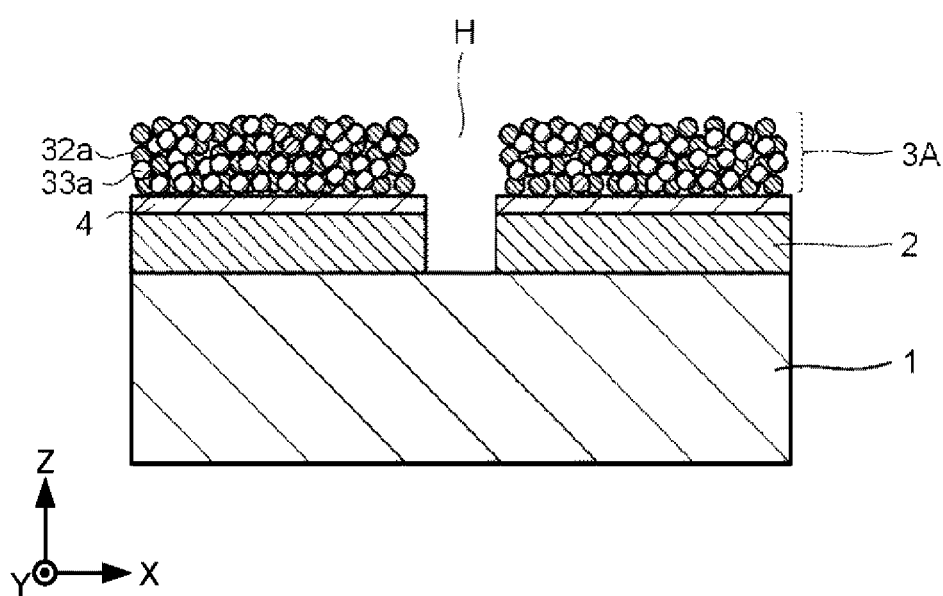
FIG. 10 is a schematic cross-sectional view illustrating an example of an etching step S1-6.

FIG. 10 is a schematic cross-sectional view illustrating an example of the etching step S1-6, and illustrates a part of the X-Z cross section of the processing target 1. As illustrated in FIG. 10, in the etching step S1-6, the mask layer 2 is etched by using the mask layer 3A and the pattern of the mask layer 3A is transferred to the mask layer 2. The mask layer 2 is etched by, for example, using dry etching or wet etching.

As described above, in the embodiment, a hard mask having a desired thickness may be easily formed, so that a pattern may be formed.

Second Embodiment

Similarly to FIG. 1, another example of the pattern forming method includes the first mask layer forming step S1-1, the second mask layer forming step S1-2, the pattern forming step S1-3, the oxidizing step S1-4, the cycle step S1-5, and the etching step S1-6. Since the first mask layer forming step S1-1 is the same as that of the first embodiment, the description thereof will be omitted in this embodiment.

[Second Mask Layer Forming Step S1-2]

Figure 11:
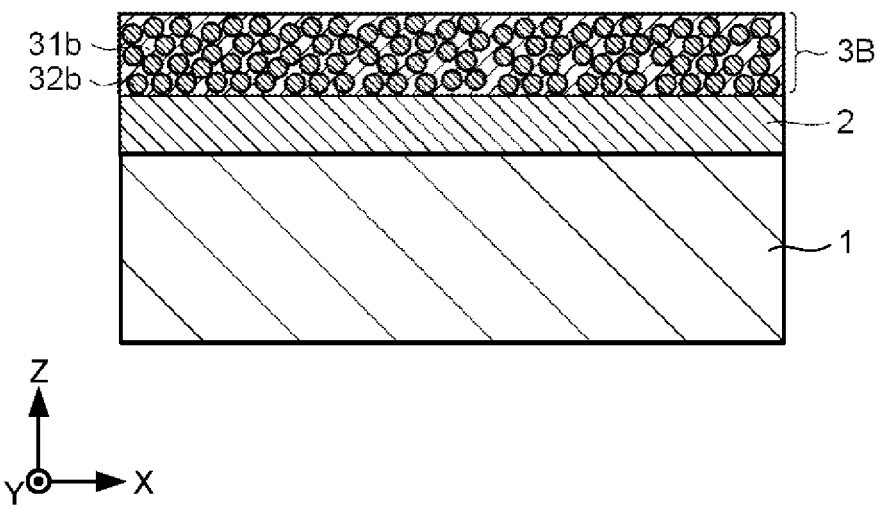
FIG. 11 is a schematic cross-sectional view illustrating an example of the second mask layer forming step S1-2.

FIG. 11 is a schematic cross-sectional view illustrating an example of the second mask layer forming step S1-2, and illustrates a part of the X-Z cross section. As illustrated in FIG. 11, in the second mask layer forming step S1-2, a mask layer 3B containing an organic material 31b and an inorganic material 32b is formed on the mask layer 2. The mask layer 3B is formed by applying a composite material containing the organic material 31b and the inorganic material 32b onto the surface of the mask layer 2. It may be desirable to use the composite material because it is not necessary to add a step of impregnating the mask layer 3B with the inorganic material 32b.

The organic material 31b is a polymer material containing carbon, and includes, for example, a resist material such as an extreme ultraviolet (EUV) curable resist. The organic material 31b has reaction sites capable of reacting with the inorganic material 32b. Meanwhile, the mask layer 2 contains an organic material that has a smaller number of reaction sites than the mask layer 3B or does not have the reaction site. As the rest of the description of the mask layer 2, the description of the mask layer 2 of the first embodiment may be appropriately incorporated.

The reaction sites that react with the inorganic material 32b include, for example, an unshared electron pair to which the inorganic material may be coordinated, and for example, may be an unshared electron pair present in a functional group such as a carbonyl group or an amide group contained in a polymer.

The inorganic material 32b is an inorganic compound containing at least one element selected from the group consisting of metal elements. The metal element includes, for example, at least one element selected from the group consisting of zirconium (Zr), hafnium (Hf), titanium (Ti), zinc (Zn), indium (In), and tin (Sn).

[Pattern Forming Step S1-3]

Figure 12:
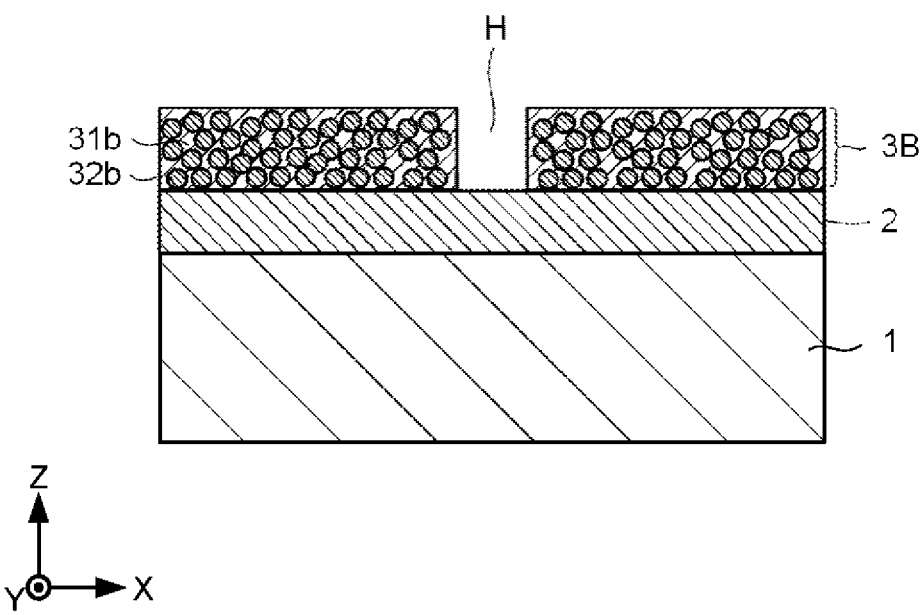
FIG. 12 is a schematic cross-sectional view illustrating the pattern forming step S1-3.

FIG. 12 is a schematic cross-sectional view illustrating the pattern forming step S1-3, and illustrates a part of the X-Z cross section of the processing target 1. As illustrated in FIG. 12, in the pattern forming step S1-3, the mask layer 3B is processed to form a pattern including the opening H.

[Oxidizing Step S1-4]

Figure 13:
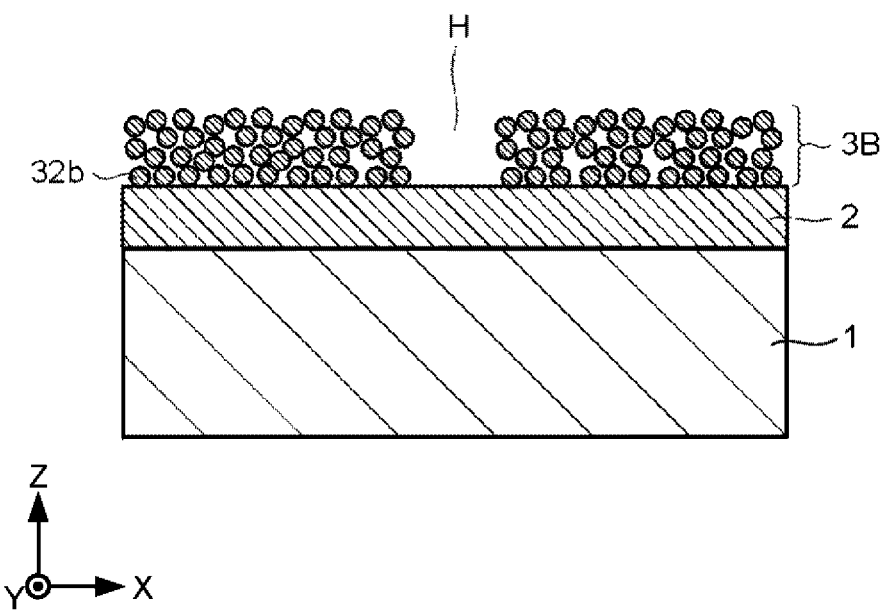
FIG. 13 is a schematic cross-sectional view illustrating an example of the oxidizing step S1-4.
Figure 14:
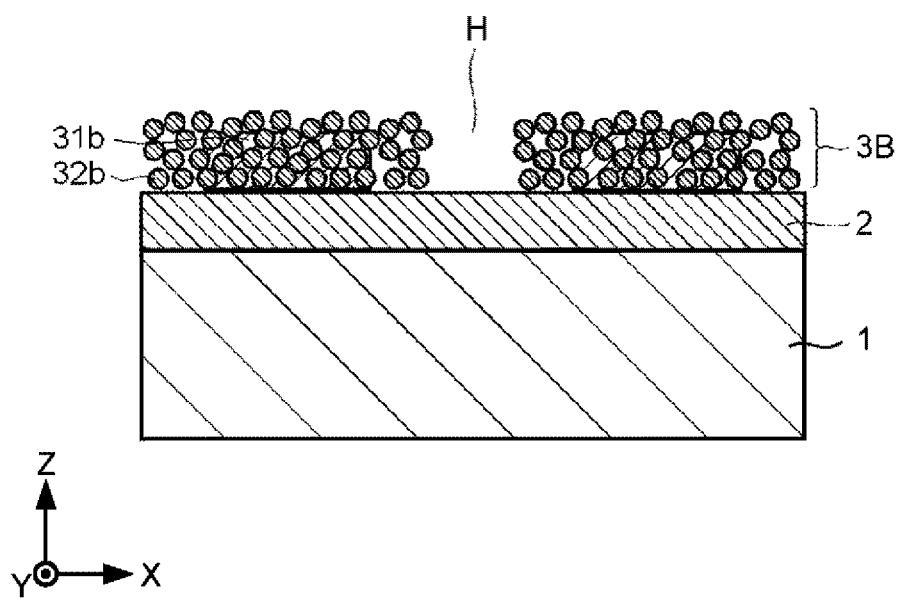
FIG. 14 is a schematic cross-sectional view illustrating an example of the oxidizing step S1-4.

FIGS. 13 and 14 are schematic cross-sectional views illustrating an example of the oxidizing step S1-4, and illustrate a part of the X-Z cross section of the processing target 1. In the oxidizing step S1-4, the mask layer 3B is exposed to the first oxidizing gas. The first oxidizing gas is exhausted after the exposure.

The organic material 31b in the mask layer 3B has reaction sites that react with the inorganic material 32b. By exposing the mask layer 3B to the first oxidizing gas, the first oxidizing gas may oxidize the inorganic material 32b to form an oxide of the inorganic material 32b.

The first oxidizing gas includes, for example, ozone. Since ozone has a high oxidizing power, when the first oxidizing gas contains ozone, as illustrated in FIGS. 13 and 14, at least a part of the organic material 31b is removed by exposing the mask layer 3B to the first oxidizing gas. The oxide of the inorganic material 32b remaining after the organic material 31b is removed is, for example, amorphous or crystalline. Therefore, etching selectivity, etching resistance, and peeling performance of the etching mask may be improved.

Due to the formation of the oxide of the inorganic material 32b or the removal of the organic material 31b, the oxygen atom concentration and the metal atom concentration of the mask layer 3B are increased, and the carbon atom concentration thereof is decreased. The oxygen atom concentration, the carbon atom concentration, and the metal atom concentration may be measured by, for example, an XPS method.

The amount of the organic material 31b removed by the exposure may be adjusted according to, for example, a processing temperature and a processing time. For example, by performing the exposure at a first processing temperature and for a first processing time, the entire organic material 31b may be removed, as illustrated in FIG. 13. Therefore, since the mask layer 3B may be formed by the inorganic material 32b, an etching mask having a high selectivity with respect to the mask layer 2 may be formed. Further, by performing the exposure at a second processing temperature lower than the first processing temperature or for a second processing time shorter than the first processing time, as illustrated in FIG. 14, a part of the organic material 31b may be removed and the other part thereof may be remained. Therefore, the shrinkage rate of the mask layer 3B may be reduced, and thus, the dimensional accuracy of the pattern may be improved.

[Cycle Step S1-5]

In the cycle step S1-5, the inorganic material introducing step S1-5-1 and the oxidizing step S1-5-2 are alternately switched, for example, until the number of cycles reaches N (N is a natural number of 1 or more). The number of the cycles is appropriately set according to parameters required for the etching mask. The cycle step S1-5 may not always be performed.

Figure 15:
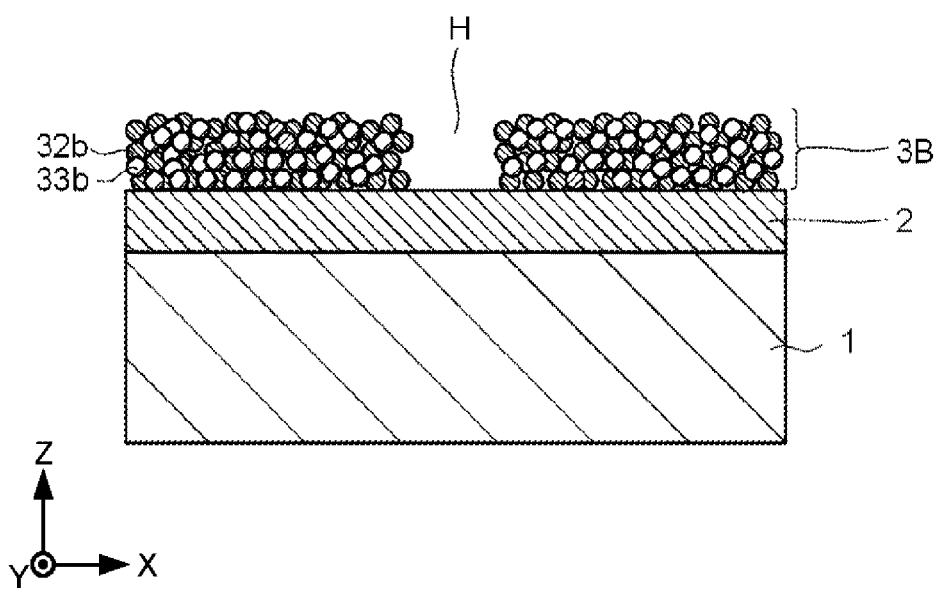
FIG. 15 is a schematic cross-sectional view illustrating an example of the cycle step S1-5.

FIG. 15 is a schematic cross-sectional view illustrating an example of the cycle step S1-5, and illustrates a part of the X-Z cross section of the processing target 1. In the inorganic material introducing step S1-5-1, the mask layer 3B is exposed to a second gas containing an inorganic material 33b, and the inorganic material 33b is introduced to the mask layer 3B. After exhausting the second gas, in the oxidizing step S1-5-2, the mask layer 3B is exposed to the second oxidizing gas containing ozone. The second oxidizing gas is exhausted after the exposure.

The inorganic material 33b reacts with the second oxidizing gas so that the inorganic material 33b is oxidized to form an oxide of the inorganic material 33b. Therefore, the film density of the mask layer 3B may be increased.

The inorganic material 33b is an inorganic compound the same as or different from the inorganic material 32b. The inorganic material 33b is an inorganic compound containing at least one element selected from the group consisting of metal elements. The metal element includes, for example, at least one element selected from the group consisting of zirconium (Zr), hafnium (Hf), titanium (Ti), zinc (Zn), indium (In), and tin (Sn).

The inorganic material 33b is, for example, a precursor that may be used in a CVD method or an ALD method. For example, an example of a precursor containing zirconium is tetrakis(dimethylamino) zirconium (TDMAZ). When using a plurality of precursors, it is desirable to use precursors that hardly react with each other or do not react with each other.

The type of the inorganic material 33b and the type of the second oxidizing gas may be changed for each cycle. Therefore, the composition ratio of each inorganic element in the mask layer 3B may be controlled, and for example, etching selectivity, etching resistance, and peeling performance of the mask layer 3B may be adjusted. Further, since it is possible to prevent the oxide of the inorganic material from being scattered and reattached to the etching surface when the processing target 1 is etched, the etching may be prevented from being hindered. Further, When the number of the cycles is two or more (N≤2), if a second oxidizing step in which ozone is used for the second oxidizing gas is performed, a second oxidizing step in which water is used for the second oxidizing gas may be performed.

The amount of the inorganic material 33b that may penetrate into the mask layer 3B containing the organic material 31b is limited depending on the reaction site. Meanwhile, the limitation of the amount is alleviated by removing at least a part of the organic material 31b in the oxidizing step S1-4.

Similarly to the first embodiment, by repeating the switching between the inorganic material introducing step S1-5-1 and the oxidizing step S1-5-2, the oxide of the inorganic material 33b may be formed on the surface of the exposed portion of the mask layer 2 in the opening H by the reaction site of the mask layer 2. At this time, the oxide may be removed by exposing the surface of the mask layer 2 to a gas containing fluorine such as sulfur hexafluoride ($SF_6$). After that, the inorganic material introducing step S1-5-1 and the oxidizing step S1-5-2 may be alternately switched again.

By alternately switching the inorganic material introducing step S1-5-1 and the oxidizing step S1-5-2, the film density of the mask layer 3B may be increased. Therefore, it is possible to increase etching resistance, particularly high reactive ion etching (RIE) resistance. For example, when forming a pattern having a high aspect ratio, the etching mask is exposed to an etching gas for a long time, and thus, high etching resistance is required.

[Etching Step S1-6]

Figure 16:
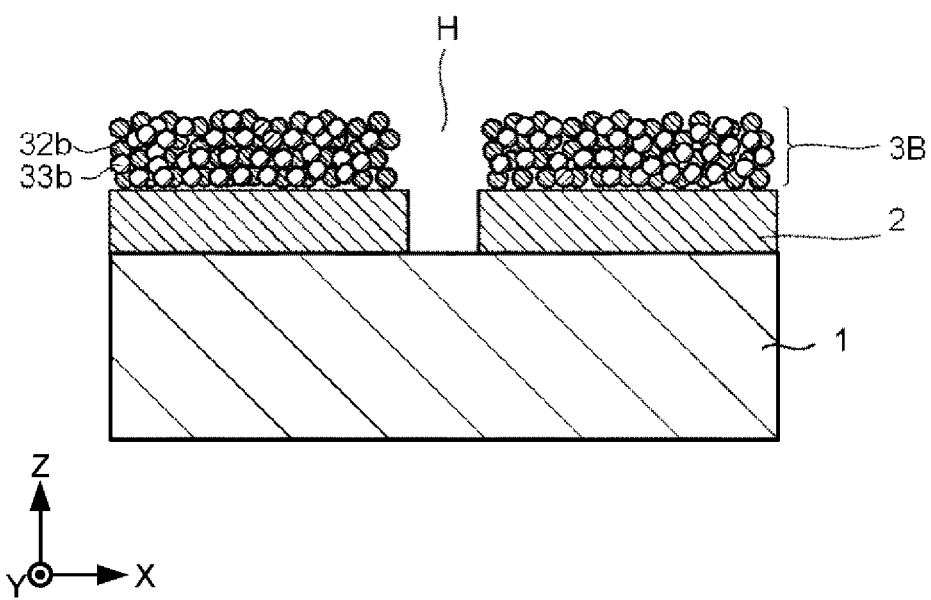
FIG. 16 is a schematic cross-sectional view illustrating an example of the etching step S1-6.

FIG. 16 is a schematic cross-sectional view illustrating an example of the etching step S1-6, and illustrates a part of the X-Z cross section of the processing target 1. As illustrated in FIG. 16, in the etching step S1-6, the mask layer 2 is etched by using the mask layer 3B and the pattern of the mask layer 3B is transferred to the mask layer 2. The mask layer 2 is etched by, for example, using dry etching or wet etching.

As described above, in the embodiment, a hard mask having a desired thickness may be easily formed, so that a pattern may be formed.

Third Embodiment

Figure 17:
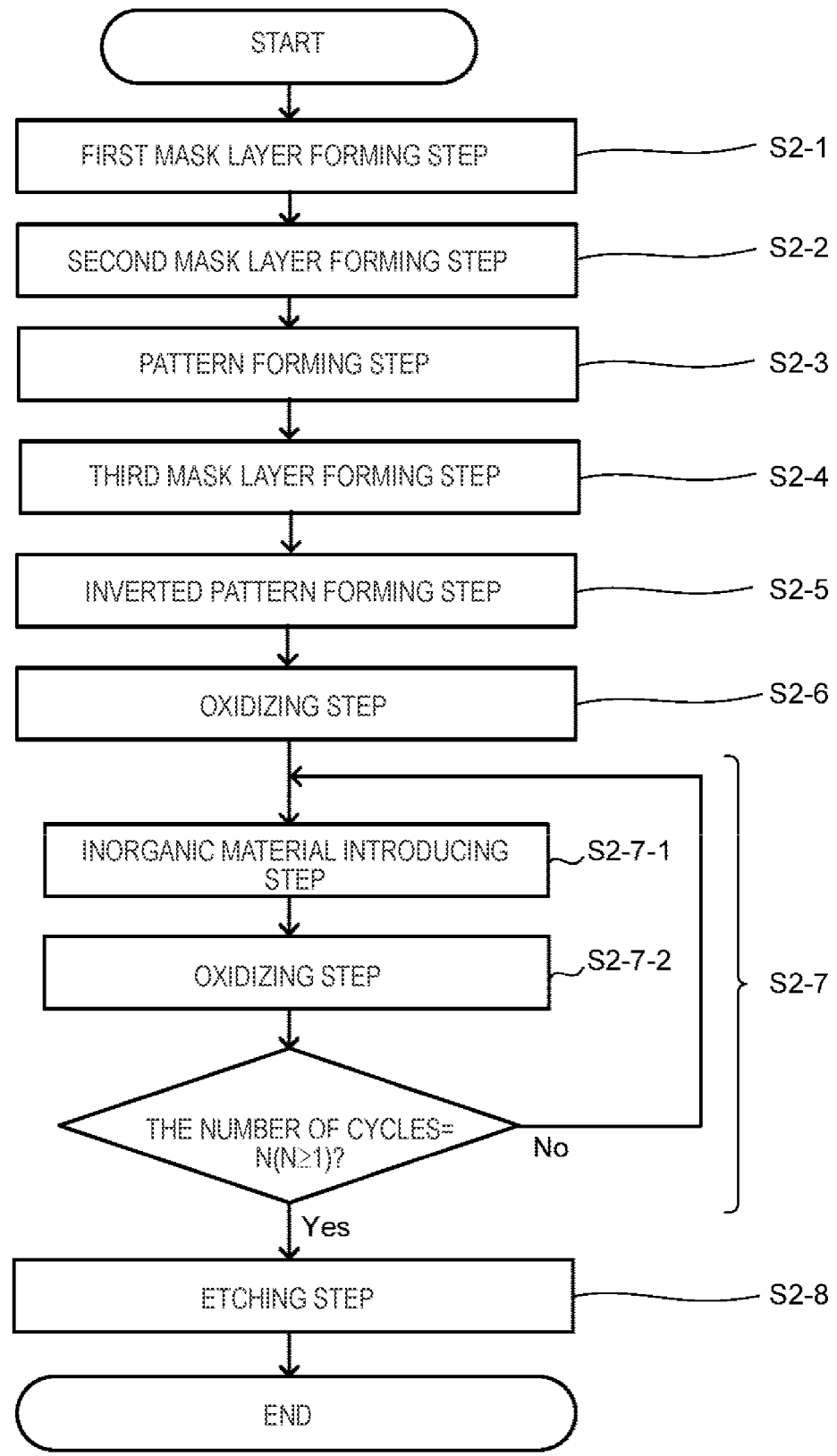
FIG. 17 is a flowchart illustrating another example of a pattern forming method.

FIG. 17 is a flowchart illustrating another example of a pattern forming method. As illustrated in FIG. 17, the example of the pattern forming method includes a first mask layer forming step S2-1, a second mask layer forming step S2-2, a pattern forming step S2-3, a third mask forming step S2-4, an inverted pattern forming step S2-5, an oxidizing step S2-6, a cycle step S2-7, and an etching step S2-8. Since the first mask layer forming step S2-1 is the same as the first mask layer forming step S1-1 of the first embodiment, the description thereof will be omitted here.

[Second Mask Layer Forming Step S2-2]

Figure 18:
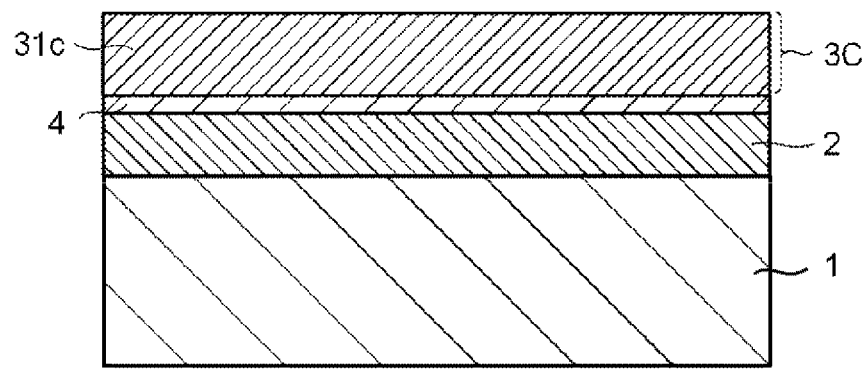
FIG. 18 is a schematic cross-sectional view illustrating an example of a second mask layer forming step S2-2.

FIG. 18 is a schematic cross-sectional view illustrating an example of the second mask layer forming step S2-2, and illustrates a part of the X-Z cross section of the processing target 1. As illustrated in FIG. 18, in the second mask layer forming step S2-2, a mask layer 3C is formed on the mask layer 2.

The mask layer 3C contains an organic material 31c. The mask layer 3C is bonded to the mask layer 2 via the adhesive layer 4. The mask layer 3C is formed by applying a material containing the organic material 31c onto the surface of the adhesive layer 4.

The organic material 31c is a polymer material containing carbon, and includes, for example, a nanoimprint material such as an ultraviolet curable resin applicable to nanoimprint lithography.

[Pattern Forming Step S2-3]

Figure 19:
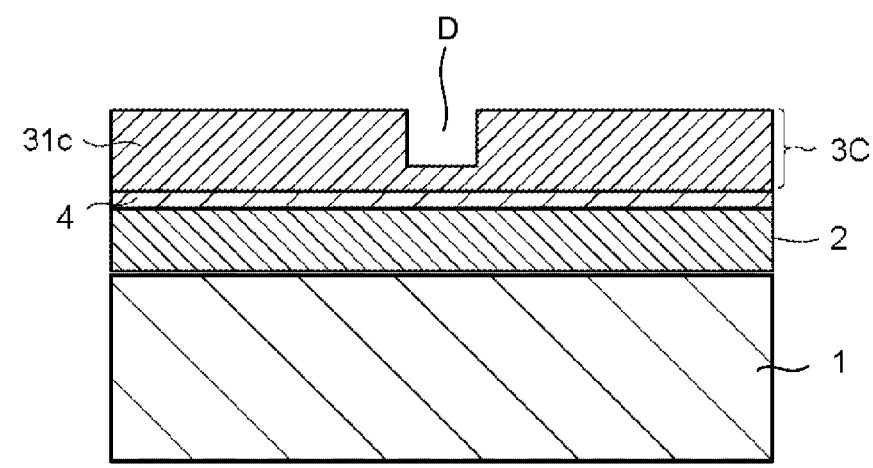
FIG. 19 is a schematic cross-sectional view illustrating a pattern forming step S2-3.

FIG. 19 is a schematic cross-sectional view illustrating the pattern forming step S2-3, and illustrates a part of the X-Z cross section of the processing target 1. As illustrated in FIG. 19, in the pattern forming step S2-3, the mask layer 3C is processed to form a recess. In the pattern forming method using NIL, a template is pressed onto the mask layer 3C and irradiated with light to cure the mask layer 3C, thereby forming a pattern including the recess D in the mask layer 3C. At this time, a part of the mask layer 3C remains under the recess D.

[Third Mask Layer Forming Step S2-4]

FIG. 20 is a schematic cross-sectional view illustrating an example of the third mask layer forming step S2-4, and illustrates a part of the X-Z cross section of the processing target 1. As illustrated in FIG. 20, in the third mask layer forming step S2-4, a mask layer 5 is formed on the mask layer 3C.

The mask layer 5 contains an organic material 51 and an inorganic material 52. The mask layer 5 is formed by applying a composite material containing the organic material 51 and the inorganic material 52 onto the surface of the mask layer 3C. It may be desirable to use the composite material because it is not necessary to add a step of impregnating the mask layer 5 with the inorganic material 52.

The organic material 51 is a polymer material containing carbon, and includes, for example, a spin on glass (SOG) film or a spin on metal (SOM) film. The SOG film is a silicon-based thin film formed by a spin coating method by applying a silicon oxide such as siloxane or a material containing silicon. The SOM film is a metal-based thin film formed by a spin coating method by applying a material containing metal. The organic material 51 has reaction sites capable of reacting with the inorganic material 52. The reaction sites capable of reacting with the inorganic material 52 include, for example, an unshared electron pair to which the inorganic material may be coordinated, and examples thereof include an unshared electron pair present in a functional group such as a carbonyl group or an amide group contained in a polymer.

In contrast to the mask layer 5, the mask layer 2 and the mask layer 3C contain an organic material that has a smaller number of reaction sites than the mask layer 5 or does not have the reaction site. In order to decrease the reaction sites of the mask layer 2 and the mask layer 3C, the oxygen concentration of the mask layer 2 and the mask layer 3C may be lower than the oxygen concentration of the mask layer 5, and the oxygen concentration of the mask layer 2 and the mask layer 3C may be 26.2% by mass or less. The oxygen concentration may be measured by measuring the atomic composition contained in the mask layer 2 and the mask layer 3C by Rutherford backscattering spectrometry (RBS) or hydrogen forward scattering spectrometry (HFS), and multiplying the composition by the atomic weight to express the oxygen content as a percentage.

The inorganic material 52 is an inorganic compound containing at least one element selected from the group consisting of semi-metal elements and metal elements. The semi-metal element includes, for example, silicon (Si). The metal element includes, for example, at least one element selected from the group consisting of titanium (Ti), tungsten (W), hafnium (Hf), zirconium (Zr), and aluminum (Al).

[Inverted Pattern Forming Step S2-5]

FIG. 21 is a schematic cross-sectional view illustrating the inverted pattern forming step S2-5, and illustrates a part of the X-Z cross section of the processing target 1. As illustrated in FIG. 21, in the inverted pattern forming step S2-5, the mask layer 5 is processed to form an inverted pattern of the pattern of the mask layer 3C. The inverted pattern includes a coating portion C. The inverted pattern is formed by etching the mask layer 5 along the thickness direction until the upper surface of the mask layer 3C is exposed, and then, etching the mask layer 3C and the adhesive layer 4 using the remaining portion of the mask layer 5.

[Oxidizing Step S2-6]

Figure 22:
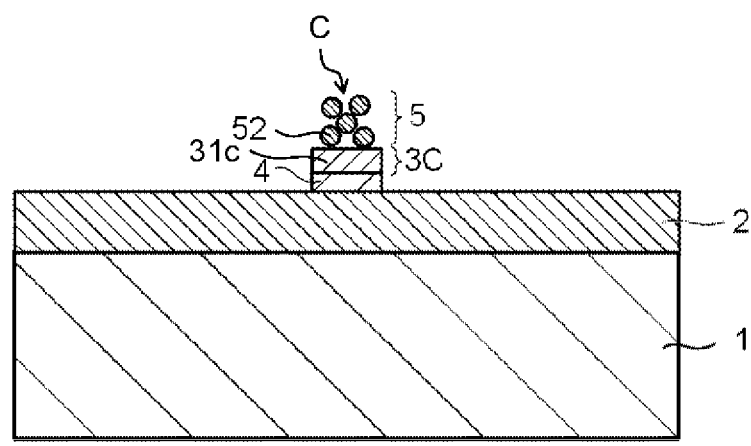
FIG. 22 is a schematic cross-sectional view illustrating an example of an oxidizing step S2-6.
Figure 23:
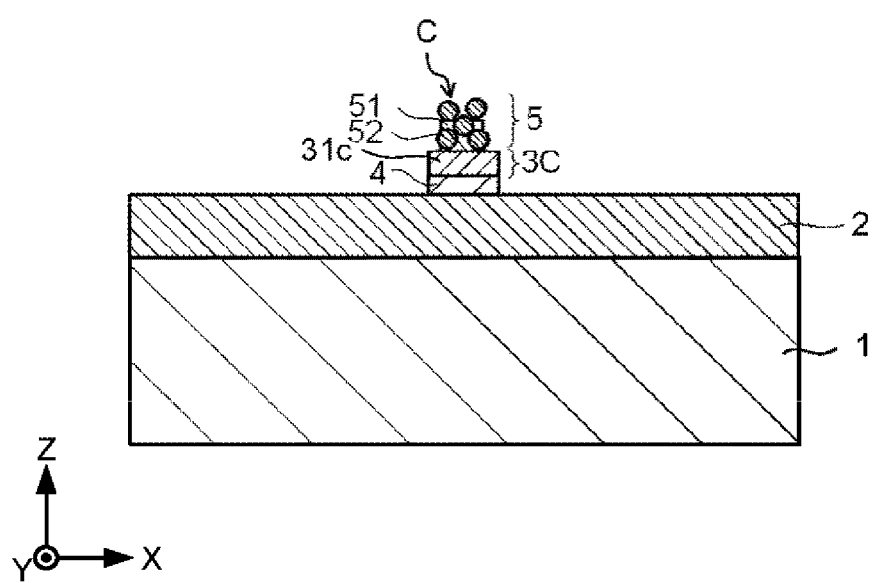
FIG. 23 is a schematic cross-sectional view illustrating an example of the oxidizing step S2-6.

FIGS. 22 and 23 are schematic cross-sectional views illustrating an example of the oxidizing step S2-6, and illustrate a part of the X-Z cross section of the processing target 1. In the oxidizing step S2-6, the mask layer 5 is exposed to the first oxidizing gas. The first oxidizing gas is exhausted after the exposure.

The organic material 51 in the mask layer 5 has reaction sites that react with the inorganic material 52. By exposing the mask layer 5 to the first oxidizing gas, the first oxidizing gas may oxidize the inorganic material 52 to form an oxide of the inorganic material 52.

The first oxidizing gas includes, for example, ozone. Since ozone has a high oxidizing power, when the first oxidizing gas contains ozone, as illustrated in FIGS. 22 and 23, at least a part of the organic material 51 is removed by exposing the mask layer 5 to the first oxidizing gas. The oxide of the inorganic material 52 remaining after the organic material 51 is removed is, for example, amorphous or crystalline. Therefore, etching selectivity, etching resistance, and peeling performance of the etching mask may be improved.

Due to the formation of the oxide of the inorganic material 52 or the removal of the organic material 51, the oxygen atom concentration and the metal atom concentration of the mask layer 5 are increased, and the carbon atom concentration thereof is decreased. The oxygen atom concentration, the carbon atom concentration, and the metal atom concentration may be measured by, for example, an XPS method.

The amount of the organic material 51 removed by the exposure may be adjusted according to, for example, the processing conditions such as a processing temperature and a processing time. For example, by performing the exposure at a first processing temperature and for a first processing time, the entire organic material 51 may be removed, as illustrated in FIG. 22. Therefore, since the mask layer 5 may be formed by the inorganic material 52, an etching mask having a high selectivity with respect to the mask layer 2 may be formed. Further, by performing the exposure at a second processing temperature lower than the first processing temperature or for a second processing time shorter than the first processing time, as illustrated in FIG. 23, a part of the organic material 51 may be removed and the other part thereof may be remained. Therefore, the shrinkage rate of the mask layer 5 may be reduced, and thus, the dimensional accuracy of the pattern may be improved.

[Cycle Step S2-7]

In the cycle step S2-7, an inorganic material introducing step S2-7-1 and an oxidizing step S2-7-2 are alternately switched, for example, until the number of cycles reaches N (N is a natural number of 1 or more). The number of the cycles is appropriately set according to parameters required for the etching mask. The cycle step S2-7 may not always be performed (N=0).

FIGS. 24 and 25 are schematic cross-sectional views illustrating an example of the cycle step S2-7, and illustrate a part of the X-Z cross section of the processing target 1. In the inorganic material introducing step S2-7-1, the mask layer 5 is exposed to a third gas containing an inorganic material 53, and as illustrated in FIG. 24, the inorganic material 53 is introduced to the mask layer 5. After exhausting the third gas, in the oxidizing step S2-7-2, the mask layer 5 is exposed to the second oxidizing gas containing ozone. The second oxidizing gas is exhausted after the exposure.

The inorganic material 53 reacts with the second oxidizing gas so that the inorganic material 53 is oxidized to form an oxide of the inorganic material 53. Therefore, the film density of the mask layer 5 may be increased.

The inorganic material 53 is an inorganic compound the same as or different from the inorganic material 52. The inorganic material 53 is an inorganic compound containing at least one element selected from the group consisting of semi-metal elements and metal elements. The semi-metal element includes, for example, silicon (Si). The metal element includes, for example, at least one element selected from the group consisting of titanium (Ti), tungsten (W), hafnium (Hf), zirconium (Zr), and aluminum (Al).

The inorganic material 53 is a precursor that may be used by, for example, a CVD method or an ALD method. For example, an example of a precursor containing silicon is tris(dimethylamino)silane (TDMAS). Further, an example of a precursor containing Zr is tetrakis(dimethylamino)zirconium (TDMAZ). When using a plurality of precursors, it is desirable to use precursors that hardly react with each other or do not react with each other.

The type of the inorganic material 53 and the type of the second oxidizing gas may be changed for each cycle. Therefore, the composition ratio of each inorganic element in the mask layer 5 may be controlled, and for example, etching selectivity, etching resistance, and peeling performance of the mask layer 5 may be adjusted. Further, since it is possible to prevent the oxide of the inorganic material from being scattered and reattached to the etching surface when the processing target 1 is etched, the etching may be prevented from being hindered. Further, when the number of the cycles is two or more (N≤2), if a second oxidizing step in which ozone is used for the second oxidizing gas is performed, a second oxidizing step in which water is used for the second oxidizing gas may be performed.

The amount of the inorganic material 53 that may penetrate into the mask layer 5 containing the inorganic material 53 is limited depending on the reaction site. Meanwhile, the limitation of the amount is alleviated by removing at least a part of the organic material 51 in the oxidizing step S2-6.

By alternately switching the inorganic material introducing step S2-7-1 and the oxidizing step S2-7-2, the film density of the mask layer 5 may be increased. Therefore, it is possible to increase etching resistance, particularly high reactive ion etching (RIE) resistance. For example, when forming a pattern having a high aspect ratio, the etching mask is exposed to an etching gas for a long time, and thus, high etching resistance is required.

By repeating the switching between the inorganic material introducing step S2-7-1 and the oxidizing step S2-7-2, as illustrated in FIG. 25, the oxide of the inorganic material 53 may be formed on the surface of the exposed portion of the mask layer 2 by the reaction site of the mask layer 2. At this time, the oxide may be removed by exposing the surface of the mask layer 2 to a gas containing fluorine such as sulfur hexafluoride ($SF_6$). After that, the inorganic material introducing step S2-7-1 and the oxidizing step S2-7-2 may be alternately switched again.

[Etching Step S2-8]

Figure 26:
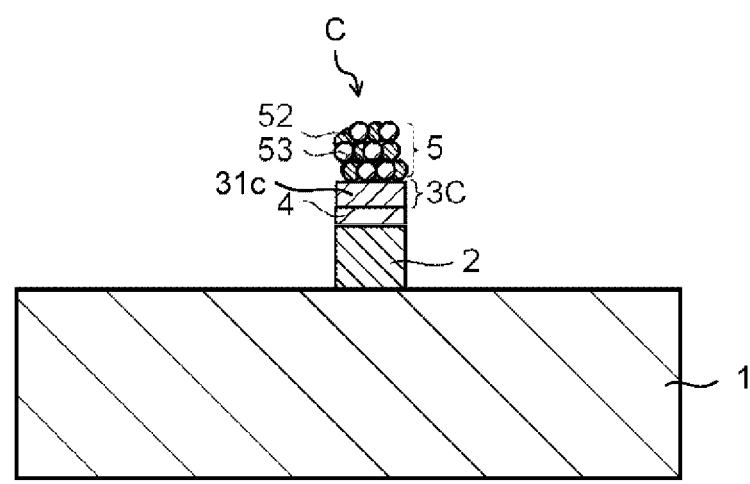
FIG. 26 is a schematic cross-sectional view illustrating an example of an etching step S2-8.

FIG. 26 is a schematic cross-sectional view illustrating an example of the etching step S2-8, and illustrates a part of the X-Z cross section of the processing target 1. As illustrated in FIG. 26, in the etching step S2-8, the mask layer 2 is etched by using the mask layer 5 and the pattern of the mask layer 5 is transferred to the mask layer 2. The mask layer 2 is etched by, for example, using dry etching or wet etching.

As described above, in the embodiment, a hard mask having a desired thickness may be easily formed, so that a pattern may be formed.

Fourth Embodiment

Similarly to FIG. 17, another example of the pattern forming method includes the first mask layer forming step S2-1, the second mask layer forming step S2-2, the pattern forming step S2-3, the third mask forming step S2-4, the inverted pattern forming step S2-5, the oxidizing step S2-6, the cycle step S2-7, and the etching step S2-8. Since the first mask layer forming step S2-1 is the same as that of the third embodiment, the description thereof will be omitted in this embodiment.

[Second Mask Layer Forming Step S2-2]

Figure 27:
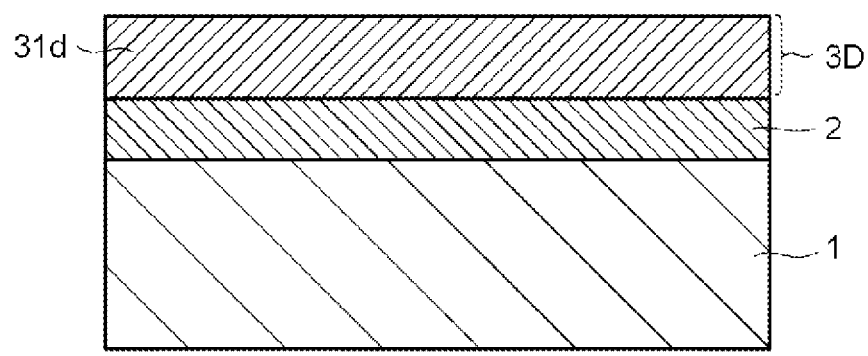
FIG. 27 is a schematic cross-sectional view illustrating an example of the second mask layer forming step S2-2.

FIG. 27 is a schematic cross-sectional view illustrating an example of the second mask layer forming step S2-2, and illustrates a part of the X-Z cross section. As illustrated in FIG. 27, in the second mask layer forming step S2-2, a mask layer 3D containing an organic material 31d is formed on the mask layer 2.

The organic material 31d is a polymer material containing carbon, and includes, for example, a resist material such as an extreme ultraviolet (EUV) curable resist. The mask layer 3D is formed by applying a material containing the organic material 31d onto the surface of the mask layer 2.

[Pattern Forming Step S2-3]

Figure 28:
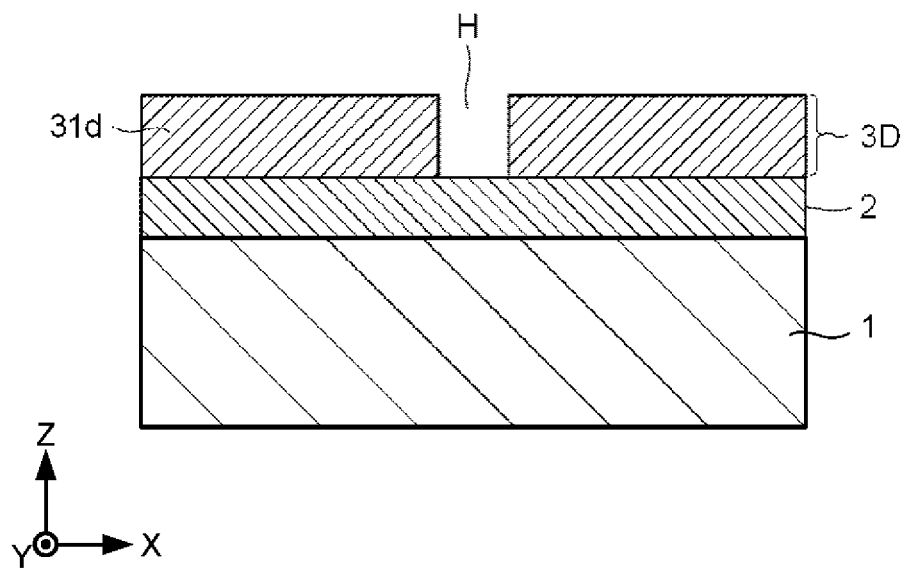
FIG. 28 is a schematic cross-sectional view illustrating the pattern forming step S2-3.

FIG. 28 is a schematic cross-sectional view illustrating the pattern forming step S2-3, and illustrates a part of the X-Z cross section of the processing target 1. As illustrated in FIG. 28, in the pattern forming step S2-3, the mask layer 3D is processed to form a pattern including the opening H.

[Third Mask Layer Forming Step S2-4]

Figure 29:
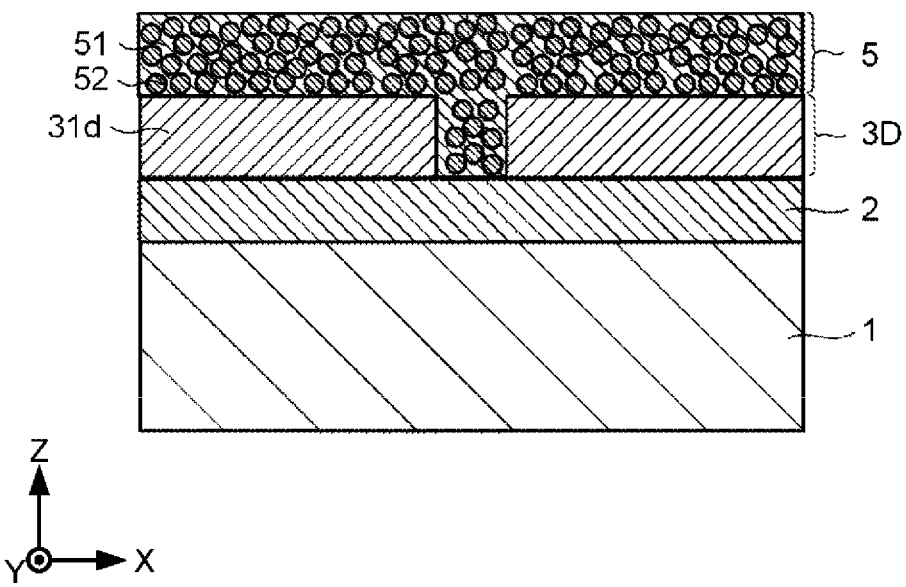
FIG. 29 is a schematic cross-sectional view illustrating an example of the third mask layer forming step S2-4.

FIG. 29 is a schematic cross-sectional view illustrating an example of the third mask layer forming step S2-4, and illustrates a part of the X-Z cross section of the processing target 1. As illustrated in FIG. 29, in the third mask layer forming step S2-4, the mask layer 5 is formed on the mask layer 3D.

The mask layer 5 contains the organic material 51 and the inorganic material 52. The mask layer 5 is formed by applying a composite material containing the organic material 51 and the inorganic material 52 onto the surface of the mask layer 3D. It may be desirable to use the composite material because it is not necessary to add a step of impregnating the mask layer 5 with the inorganic material 52. Since the rest of the descriptions of the mask layer 5, the organic material 51, and the inorganic material 52 are the same as those of the third embodiment, the descriptions thereof will be omitted here.

[Inverted Pattern Forming Step S2-5]

FIG. 30 is a schematic cross-sectional view illustrating the inverted pattern forming step S2-5, and illustrates a part of the X-Z cross section of the processing target 1. As illustrated in FIG. 30, in the inverted pattern forming step S2-5, the mask layer 5 is processed to form an inverted pattern of the pattern of the mask layer 3D. The inverted pattern includes the coating portion C. The inverted pattern is formed by etching the mask layer 5 along the thickness direction until the surface of the mask layer 3D is exposed, and then, etching the mask layer 3D using the remaining portion of the mask layer 5.

[Oxidizing Step S2-6]

Figure 32:
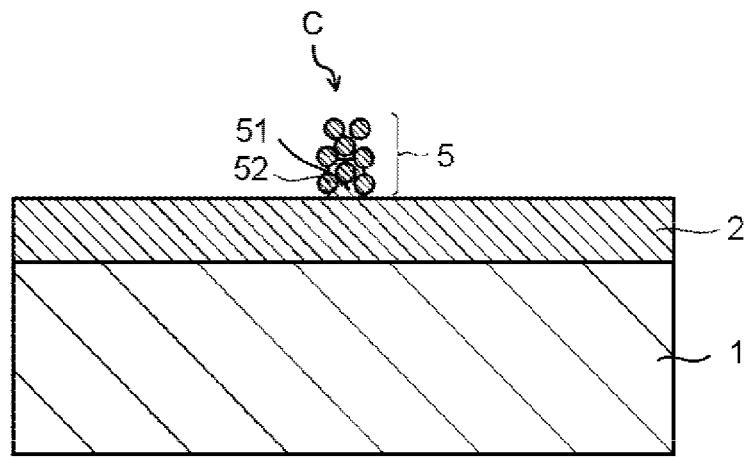
FIG. 32 is a schematic cross-sectional view illustrating an example of the oxidizing step S2-6.

FIGS. 31 and 32 are schematic cross-sectional views illustrating an example of the oxidizing step S2-6, and illustrate a part of the X-Z cross section of the processing target 1. In the oxidizing step S2-6, the mask layer 5 is exposed to the first oxidizing gas. The first oxidizing gas is exhausted after the exposure.

The organic material 51 in the mask layer 5 has reaction sites that react with the inorganic material 52. By exposing the mask layer 5 to the first oxidizing gas, the first oxidizing gas may oxidize the inorganic material 52 to form an oxide of the inorganic material 52.

The first oxidizing gas includes, for example, ozone. Since ozone has a high oxidizing power, when the first oxidizing gas contains ozone, as illustrated in FIGS. 31 and 32, at least a part of the organic material 51 is removed by exposing the mask layer 5 to the first oxidizing gas. The oxide of the inorganic material 52 remaining after the organic material 51 is removed is, for example, amorphous or crystalline. Therefore, etching selectivity, etching resistance, and peeling performance of the etching mask may be improved.

Due to the formation of the oxide of the inorganic material 52 or the removal of the organic material 51, the oxygen atom concentration and the metal atom concentration of the mask layer 5 are increased, and the carbon atom concentration thereof is decreased. The oxygen atom concentration, the carbon atom concentration, and the metal atom concentration may be measured by, for example, an XPS method.

The amount of the organic material 51 removed by the exposure may be adjusted according to, for example, the processing conditions such as a processing temperature and a processing time. For example, by performing the exposure at a first processing temperature and for a first processing time, the entire organic material 51 may be removed, as illustrated in FIG. 31. Therefore, since the mask layer 5 may be formed by the inorganic material 52, an etching mask having a high selectivity with respect to the mask layer 2 may be formed. Further, by performing the exposure at a second processing temperature lower than the first processing temperature or for a second processing time shorter than the first processing time, as illustrated in FIG. 32, a part of the organic material 51 may be removed and the other part thereof may be remained. Therefore, the shrinkage rate of the mask layer 5 may be reduced, and thus, the dimensional accuracy of the pattern may be improved.

[Cycle Step S2-7]

In the cycle step S2-7, the inorganic material introducing step S2-7-1 and the oxidizing step S2-7-2 are alternately switched, for example, until the number of cycles reaches N (N is a natural number of 1 or more). The number of the cycles is appropriately set according to parameters required for the etching mask. The cycle step S2-7 may not always be performed.

Figure 33:
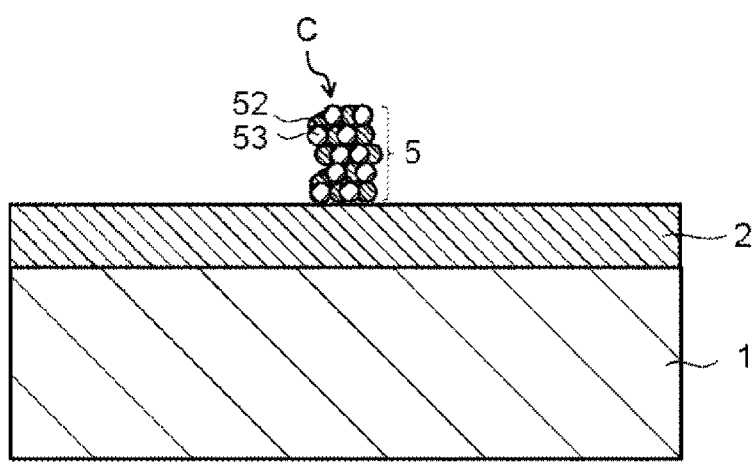
FIG. 33 is a schematic cross-sectional view illustrating an example of the cycle step S2-7.

FIG. 33 is a schematic cross-sectional view illustrating an example of the cycle step S2-7, and illustrates a part of the X-Z cross section of the processing target 1. In the inorganic material introducing step S2-7-1, the mask layer 5 is exposed to a third gas containing the inorganic material 53, and as illustrated in FIG. 33, the inorganic material 53 is introduced to the mask layer 5. After exhausting the third gas, in the oxidizing step S2-7-2, the mask layer 5 is exposed to the second oxidizing gas containing ozone. The second oxidizing gas is exhausted after the exposure.

The inorganic material 53 reacts with the second oxidizing gas so that the inorganic material 53 is oxidized to form an oxide of the inorganic material 53. Therefore, the film density of the mask layer 5 may be increased. Since the rest of the description of the inorganic material 53 is the same as that of the third embodiment, the description thereof will be omitted here.

The type of the inorganic material 53 and the type of the second oxidizing gas may be changed for each cycle. Therefore, the composition ratio of each inorganic element in the mask layer 5 may be controlled, and for example, etching selectivity, etching resistance, and peeling performance of the mask layer 5 may be adjusted. Further, since it is possible to prevent the oxide of the inorganic material from being scattered and reattached to the etching surface when the processing target 1 is etched, the etching may be prevented from being hindered. Further, when the number of the cycles is two or more (N≤2), if a second oxidizing step in which ozone is used for the second oxidizing gas is performed, a second oxidizing step in which water is used for the second oxidizing gas may be performed.

The amount of the inorganic material 53 that may penetrate into the mask layer 5 containing the inorganic material 53 is limited depending on the reaction site. Meanwhile, the limitation of the amount is alleviated by removing at least a part of the organic material 51 in the oxidizing step S2-6.

By alternately switching the inorganic material introducing step S2-7-1 and the oxidizing step S2-7-2, the film density of the mask layer 5 may be increased. Therefore, it is possible to increase etching resistance, particularly high reactive ion etching (RIE) resistance. For example, when forming a pattern having a high aspect ratio, the etching mask is exposed to an etching gas for a long time, and thus, high etching resistance is required.

By repeating the switching between the inorganic material introducing step S2-7-1 and the oxidizing step S2-7-2, the oxide of the inorganic material 52 may be formed on the surface of the exposed portion of the mask layer 2 by the reaction site of the mask layer 2. At this time, the oxide may be removed by exposing the surface of the mask layer 2 to a gas containing fluorine such as sulfur hexafluoride ($SF_6$). After that, the inorganic material introducing step S2-7-1 and the oxidizing step S2-7-2 may be alternately switched again.

[Etching Step S2-8]

FIG. 34 is a schematic cross-sectional view illustrating an example of the etching step S2-8, and illustrates a part of the X-Z cross section of the processing target 1. As illustrated in FIG. 34, in the etching step S2-8, the mask layer 2 is etched by using the mask layer 5 and the pattern of the mask layer 5 is transferred to the mask layer 2. The mask layer 2 is etched by, for example, using dry etching or wet etching.

As described above, in the embodiment, a hard mask having a desired thickness may be easily formed, so that a pattern may be formed.

Fifth Embodiment

FIG. 35 is a flowchart illustrating an example of a method for manufacturing a semiconductor device. As illustrated in FIG. 35, the example of the method for manufacturing a semiconductor device includes an etching mask forming step S10 and an etching step S20.

[Etching Mask Forming Step S10]

Figure 36:
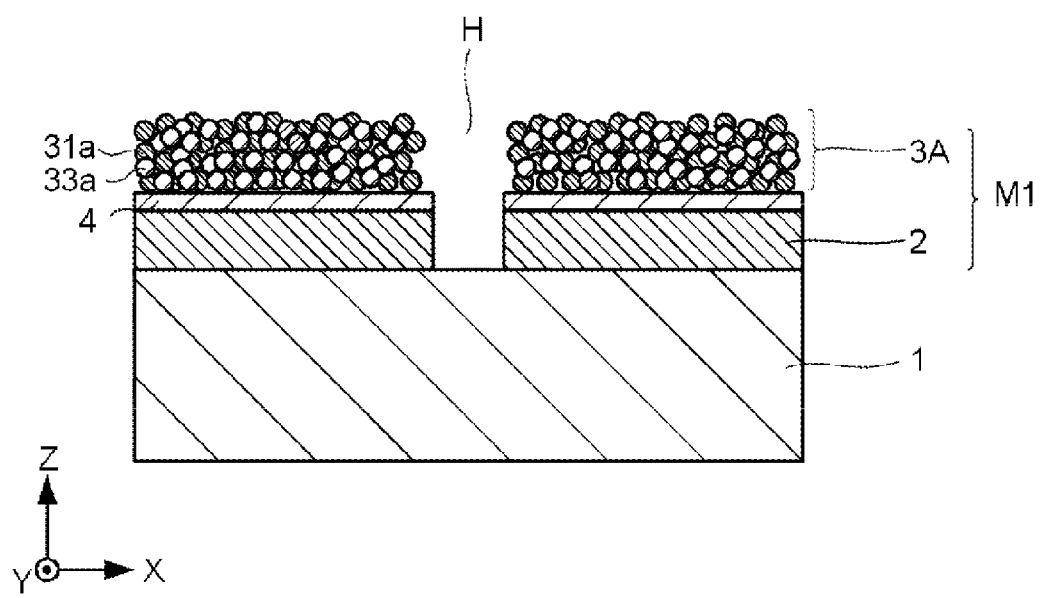
FIG. 36 is a schematic cross-sectional view illustrating an example of an etching mask forming step S10.

FIG. 36 is a schematic cross-sectional view illustrating an example of the etching mask forming step S10, and illustrates a part of the X-Z cross section of the processing target 1. In the etching mask forming step S10, an etching mask M1 is formed on the processing target 1. The etching mask M1 is a hard mask, and has a pattern including the opening H. FIG. 36 illustrates the etching mask M1 formed by the method according to the first embodiment, but there is no limitation thereto. The etching mask M1 may be formed by using the method according to the second embodiment.

[Etching Step S20]

Figure 37:
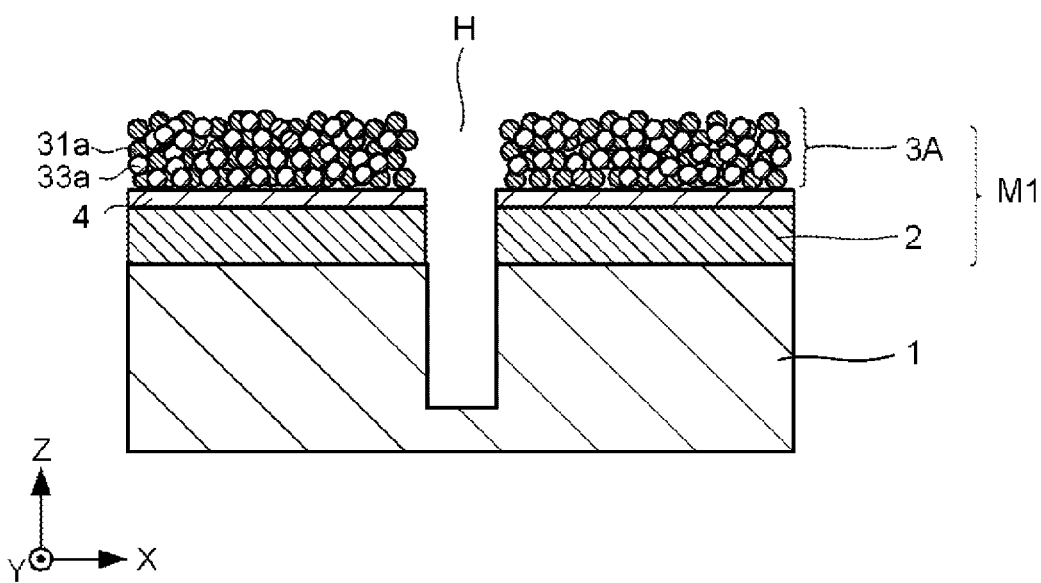
FIG. 37 is a schematic cross-sectional view illustrating an example of an etching step S20.

FIG. 37 is a schematic cross-sectional view illustrating an example of the etching step S20, and illustrates a part of the X-Z cross section of the processing target 1. In the etching step S20, the processing target 1 is etched by using the etching mask M1. The processing target 1 may be etched, for example, by RIE. The etching mask M1 is removed after the etching.

As described above, in the embodiment, the hard mask having a pattern is formed by the method disclosed in the above-described embodiments, and the processing target is etched by using the hard mask, and thus, even when the pattern has a high aspect ratio, the processing target may be easily etched to form the pattern.

Sixth Embodiment

Similarly to the fifth embodiment, the other example of the method for manufacturing a semiconductor device includes the etching mask forming step S10 and the etching step S20.

[Etching Mask Forming Step S10]

FIG. 38 is a schematic cross-sectional view illustrating an example of the etching mask forming step, and illustrates a part of the X-Z cross section of the processing target 1. In the etching mask forming step, an etching mask M2 is formed on the processing target 1. The etching mask M2 is a hard mask, and has a pattern including the coating portion C. FIG. 38 illustrates the etching mask M2 formed by the method according to the third embodiment, but there is no limitation thereto. The etching mask M2 may be formed by using the method according to the fourth embodiment.

[Etching Step S20]

FIG. 39 is a schematic cross-sectional view illustrating an example of the etching step, and illustrates a part of the X-Z cross section of the processing target 1. In the etching step, the processing target 1 is etched by using the etching mask M2. The processing target 1 may be etched, for example, by RIE. The etching mask M2 is removed after the etching.

As described above, in the embodiment, the hard mask having a pattern is formed by the method disclosed in the above-described embodiments, and the processing target is etched by using the hard mask, and thus, even when the pattern has a high aspect ratio, the processing target may be easily etched to form the pattern.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A pattern forming method comprising:
    forming a first mask layer on a sample;
    forming a second mask layer on the first mask layer, the second mask layer containing a first inorganic material and a first organic material;
    performing a lithography in the second mask layer;
    forming a pattern in the second mask layer;
    oxidizing the first inorganic material and removing at least a portion of the first organic material from the second mask layer by exposing the second mask layer to a first oxidizing gas containing ozone; and
    transferring the pattern to the first mask layer by etching the first mask layer with the second mask layer.

2. The pattern forming method according to claim 1, wherein only a portion of the first organic material is removed from the second mask layer by exposing the second mask layer to the first oxidizing gas.

3. The pattern forming method according to claim 1, wherein all of the first organic material is removed from the second mask layer by exposing the second mask layer to the first oxidizing gas.

4. The pattern forming method according to claim 1, wherein the first inorganic material contains silicon, and the first organic material contains a nanoimprint material.

5. The pattern forming method according to claim 1, wherein
    the first inorganic material contains at least one of zirconium, hafnium, titanium, zinc, indium, or tin, and
    the first organic material contains a resist material.

6. The pattern forming method according to claim 1, further comprising:
    alternately switching between: (i) exposing the second mask layer to a gas containing a second inorganic material the same as or different from the first inorganic material after exposing the second mask layer to the first oxidizing gas, and (ii) exposing the second mask layer to a second oxidizing gas containing ozone.

7. The pattern forming method according to claim 6, further comprising:
after the switching, exposing a surface of the first mask layer to a gas containing fluorine.

8. The pattern forming method according to claim 1, wherein an oxygen concentration of the first mask layer is 26.2% by mass or less.

9. A pattern forming method comprising:
forming a first mask layer containing a first organic material on a sample;
forming a second mask layer containing a second organic material on the first mask layer;
processing the second mask layer to form a pattern;
forming a third mask layer on the second mask layer, the third mask layer containing a third inorganic material and a third organic material;
forming an inverted pattern to the pattern in the third mask layer;
oxidizing the third inorganic material and removing at least a portion of the third organic material from the third mask layer by exposing the third mask layer to a first oxidizing gas containing ozone; and
transferring the inverted pattern to the first mask layer by etching the first mask layer with the third mask layer.

10. The pattern forming method according to claim 9, wherein only a portion of the third organic material is removed from the third mask layer by exposing the third mask layer to the first oxidizing gas.

11. The pattern forming method according to claim 9, wherein all of the third organic material is removed from the third mask layer by exposing the third mask layer to the first oxidizing gas.

12. The pattern forming method according to claim 9, wherein
the third inorganic material contains at least one of silicon, titanium, hafnium, zirconium, or aluminum, and
the second organic material contains a nanoimprint material.

13. The pattern forming method according to claim 9, wherein
the third inorganic material contains at least one of silicon, titanium, hafnium, zirconium, or aluminum, and
the second organic material contains a resist material.

14. The pattern forming method according to claim 9, further comprising:
alternately switching between: (i) exposing the third mask layer to a gas containing a fourth inorganic material the same as or different from the third inorganic material after exposing the third mask layer to the first oxidizing gas, and (ii) exposing the third mask layer to a second oxidizing gas containing ozone.

15. A method for manufacturing a semiconductor device, the method comprising:
forming a first mask layer on a sample;
forming a second mask layer on the first mask layer, the second mask layer containing a first inorganic material and a first organic material;
performing a lithography in the second mask layer;
forming a pattern in the second mask layer;
oxidizing the first inorganic material and removing at least a portion of the first organic material from the second mask layer by exposing the second mask layer to a first oxidizing gas containing ozone;
transferring the pattern to the first mask layer by etching the first mask layer with the second mask layer to form an etching mask; and
etching the sample using the etching mask.

16. The pattern forming method according to claim 15, wherein only a portion of the first organic material is removed from the second mask layer by exposing the second mask layer to the first oxidizing gas.

17. The pattern forming method according to claim 15, wherein all of the first organic material is removed from the second mask layer by exposing the second mask layer to the first oxidizing gas.

18. The pattern forming method according to claim 15, wherein the first inorganic material contains silicon, and the first organic material contains a nanoimprint material.

19. The pattern forming method according to claim 15, wherein
the first organic material contains a resist material.

20. The pattern forming method according to claim 19, wherein
the first inorganic material contains at least one of zirconium, hafnium, titanium, zinc, indium, or tin.

21. The pattern forming method according to claim 15, further comprising:
alternately switching between: (i) exposing the second mask layer to a gas containing a second inorganic material the same as or different from the first inorganic material after exposing the second mask layer to the first oxidizing gas, and (ii) exposing the second mask layer to a second oxidizing gas containing ozone; and
after the switching, exposing a surface of the first mask layer to a gas containing fluorine.

22. The pattern forming method according to claim 15, wherein an oxygen concentration of the first mask layer is 26.2% by mass or less.

* * * * *